United States Patent
Park et al.

(10) Patent No.: US 12,119,830 B2
(45) Date of Patent: Oct. 15, 2024

(54) SYSTEMS AND METHODS FOR PLL GAIN CALIBRATION AND DUTY CYCLE CALIBRATION USING SHARED PHASE DETECTOR

(71) Applicant: Apple Inc., Cupertino, CA (US)

(72) Inventors: Jongmin Park, San Diego, CA (US); Karim M Megawer, San Diego, CA (US); Thomas Mayer, Linz (AT)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/120,819

(22) Filed: Mar. 13, 2023

(65) Prior Publication Data

US 2024/0313787 A1  Sep. 19, 2024

(51) Int. Cl.
  *H03L 7/083*  (2006.01)
  *H03L 7/081*  (2006.01)
  *H03L 7/195*  (2006.01)

(52) U.S. Cl.
  CPC ............ *H03L 7/083* (2013.01); *H03L 7/0818* (2013.01); *H03L 7/195* (2013.01)

(58) Field of Classification Search
  CPC ......... H03L 7/081; H03L 7/087; H03L 7/093; H03L 7/083; H03L 7/0818; H03L 7/195; H03C 3/0991
  See application file for complete search history.

(56) References Cited

U.S. PATENT DOCUMENTS

| | | | |
|---|---|---|---|
| 7,103,425 B1 | 9/2006 | Marra | |
| 7,119,591 B1 | 10/2006 | Lin | |
| 7,298,807 B2 | 11/2007 | Zerbe | |
| 7,375,593 B2 | 5/2008 | Self | |
| 7,511,543 B2 | 3/2009 | Friedman | |
| 9,209,966 B1 | 12/2015 | Hossain | |
| 9,240,772 B2 | 1/2016 | Drago | |
| 9,531,394 B1 | 6/2016 | Caffee | |
| 9,564,908 B2 | 2/2017 | Song | |
| 9,634,678 B1 | 4/2017 | Caffee | |
| 9,742,386 B2 | 8/2017 | Jin | |
| 10,110,239 B1* | 10/2018 | Shu | ...... H03K 5/1565 |
| 10,778,236 B2 | 9/2020 | Aga | |
| 10,895,850 B1 | 1/2021 | Elkholy | |
| 10,897,259 B1* | 1/2021 | Kim | ...... H03L 7/093 |
| 10,917,078 B2 | 2/2021 | Wu | |
| 11,245,402 B2 | 2/2022 | Tajalli | |
| 11,314,107 B2 | 4/2022 | Doppalapudi | |
| 11,316,522 B2 | 4/2022 | Rafi | |

(Continued)

Primary Examiner — John W Poos
(74) Attorney, Agent, or Firm — Fletcher Yoder, P.C.

(57) ABSTRACT

This disclosure is directed to enhancing PLL performance via gain calibration and duty cycle calibration. It may be desirable to perform loop gain and duty cycle calibration simultaneously. However, doing so may result in prohibitive complexity and/or area/power penalty. To enable loop gain calibration and duty cycle calibration simultaneously, the duty cycle error and the gain error may be detected in the time domain, which may enable duty cycle calibration and loop gain calibration circuitries to share a phase detector. Detecting the duty cycle error and the loop gain error in the time domain may be accomplished by implementing an analog or digital PLL system, wherein the loop gain of the PLL system is a function of the input phase offset time.

20 Claims, 17 Drawing Sheets

(56) References Cited

U.S. PATENT DOCUMENTS

2010/0109725 A1* 5/2010 Yun .................. H03L 7/0818
327/158
2021/0358534 A1* 11/2021 Choi .................. H03L 7/0816
2022/0103166 A1 3/2022 Balasubramanian

* cited by examiner

SYSTEMS AND METHODS FOR PLL GAIN CALIBRATION AND DUTY CYCLE CALIBRATION USING SHARED PHASE DETECTOR

BACKGROUND

The present disclosure relates generally to phase-locked loops (PLLs). In particular, the present disclosure relates to calibrating loop gain and duty cycle with respect to PLLs.

To enhance phase-locked loop (PLL) performance, PLL gain calibration and PLL duty-cycle calibration may be desirable. PLL loop gain may vary with respect to process, voltage, and temperature (PVT). PLL loop gain variation may result in a variation of a noise transfer function of a reference clock and/or voltage-controlled oscillator (VCO), which may result in sub-optimal PLL phase noise performance. In some cases, low phase noise PLL architectures may include a static phase offset at the PLL input between a reference path and a feedback path that is a function of PLL loop gain. To control the PLL loop gain, a gain calibration loop may be implemented. However, calibrating the loop gain by directly measuring the loop gain may be suboptimal or impractical.

In some cases, higher reference clock frequency may assist in reducing phase noise and increasing power efficiency of the PLL. A frequency doubler may increase the PLL reference clock frequency, but the duty cycle error in the clock may result in a spur at a clock frequency offset. As previously stated, low phase noise PLL architectures may include a static phase offset at the PLL input between the reference path and the feedback path, and the static phase offset may vary with PVT. This variation may limit the accuracy of duty cycle error detection. In some cases, correcting for the static phase offset would cause a disturbance at the PLL output, which may be unideal for PLL performance.

In some cases, it may be desirable to determine and perform loop gain and duty cycle gain calibration simultaneously. However, doing so result in prohibitive complexity and/or area/power penalty.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a transceiver includes receive circuitry, transmit circuitry, and a phase locked loop (PLL). The PLL includes a phase detector coupled to a delay element and feedback circuitry, duty cycle calibration circuitry coupled to an output of the phase detector, and gain calibration circuitry coupled to an output of the phase detector, and an input of gain circuitry.

In another embodiment, a phase-locked loop includes a phase detector configured to receive a delayed reference signal, receive a feedback signal, and output an error signal based on a first plurality of pulses of the delayed reference signal aligning with a second plurality of pulses of the feedback signal, gain calibration circuitry configured to receive the error signal, output an average value of the error signal, and adjust loop gain parameters or maintain the loop gain parameters of the phase-locked loop based on an average value of the error signal, and duty cycle calibration circuitry configured to receive the error signal, output the average value of the error signal, and output a duty cycle corrections based on the average value of the error signal including a positive or a negative value.

In yet another embodiment, a method includes receiving a reference signal at a time-to-digital converter (TDC) of a phase-locked loop (PLL); receiving a feedback signal at the TDC from feedback circuitry; and outputting, via the TDC, an error signal to gain calibration circuitry and duty cycle calibration circuitry based on whether a first plurality of pulses associated with the reference signal are aligned with a second plurality of pulses associated with the feedback signal.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
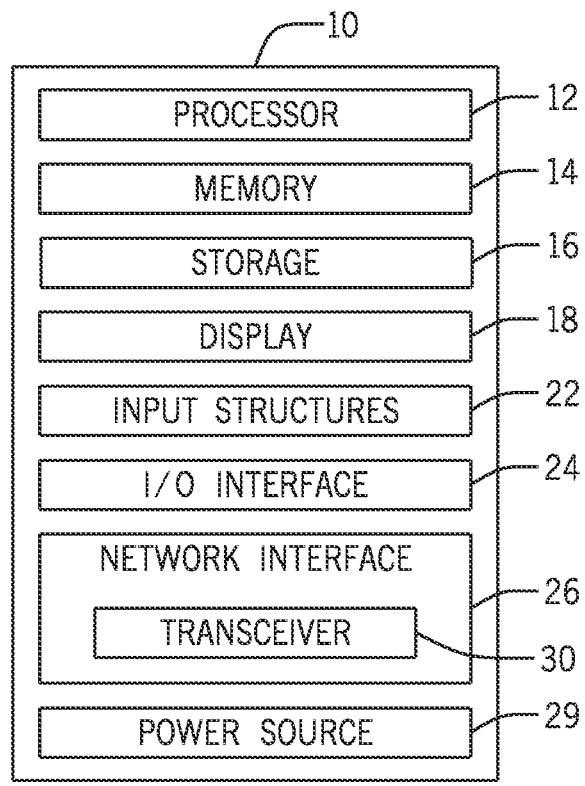
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to PLLs, and, in particular, to enhancing PLL performance via gain calibration and duty cycle calibration. PLL loop gain may vary with respect to process, voltage, and temperature (PVT) variation. PLL loop gain variation may result in a variation of a noise transfer function of a reference clock and/or voltage-controlled oscillator (VCO), which may result in sub-optimal PLL phase noise performance. In some cases, low phase noise PLL architectures may include a phase offset at the PLL input between a reference path and a feedback path that is a function of PLL loop gain. To control the PLL loop gain, a gain calibration loop may be implemented. However, calibrating the loop gain by directly measuring the loop gain may be suboptimal or impractical.

As such, to reduce or eliminate PLL loop gain variation due to PVT variation, a PLL having a loop gain function that is a function of an input phase offset time with a phase noise (PN) performance that remains consistent across PVT variations is disclosed. For enhanced performance of the gain calibration loop, phase offset information may be extracted. By determining a relationship between PLL loop gain and phase offset, detecting and calibrating phase offset may result in enhanced calibration of the PLL loop gain, while avoiding the additional difficulty and complexity associated with directly measuring loop gain of a PLL.

In some cases, higher reference clock frequency may assist in reducing phase noise and increasing power efficiency of the PLL. A frequency doubler may increase the PLL reference clock frequency, but the duty cycle error in the clock may result in a spur at a clock frequency offset. As previously stated, low phase noise PLL architectures may include a phase offset at the PLL input between the reference path and the feedback path, and the phase offset may vary with PVT. This variation may limit the accuracy of duty cycle error detection. In some cases, correcting for the phase offset may cause a disturbance at the PLL output, which may be unideal for PLL performance. To reduce or eliminate the duty cycle error caused by the higher reference clock frequency, a duty cycle calibration loop may be introduced. For the duty cycle calibration loop, the phase offset information for even clock instances and odd clock instances may be extracted.

Moreover, in some cases, it may be desirable to perform loop gain and duty cycle calibration concurrently or simultaneously. However, doing so may result in prohibitive complexity and/or an unacceptable area/power penalty. To enable concurrent or simultaneous loop gain calibration and duty cycle calibration, the duty cycle error and the gain error may be detected in the time domain, which may enable duty cycle calibration and loop gain calibration to be performed using a shared phase detector. Detecting the duty cycle error and the loop gain error in the time domain may be accomplished by implementing an analog PLL system, wherein the loop gain of the PLL system is a function of the input phase offset time. The output of the phase detector indicates the duty cycle error from the target clock duty cycle. Moreover, utilizing a single phase detector for both calibrations may enable extracting the phase offset information used by the loop gain calibration and the phase offset information used by the duty cycle calibration via the single phase detector rather than using one phase detector for each calibration, which may reduce circuit complexity and power/area consumption.

Accordingly, detecting duty cycle error and loop gain error in the time domain and utilizing one phase detector for both duty cycle calibration and loop gain calibration may enable concurrent or simultaneous duty cycle calibration and loop gain calibration, while minimizing or reducing system complexity, power consumption, and area consumption.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a 3rd generation (3G) cellular network, universal mobile telecommunication system (UMTS), 4th generation (4G) cellular network, Long Term Evolution® (LTE) cellular network, Long Term Evolution License Assisted Access (LTE-LAA) cellular network, $5^{th}$ generation (5G) cellular network, and/or New Radio (NR) cellular network, a 6th generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
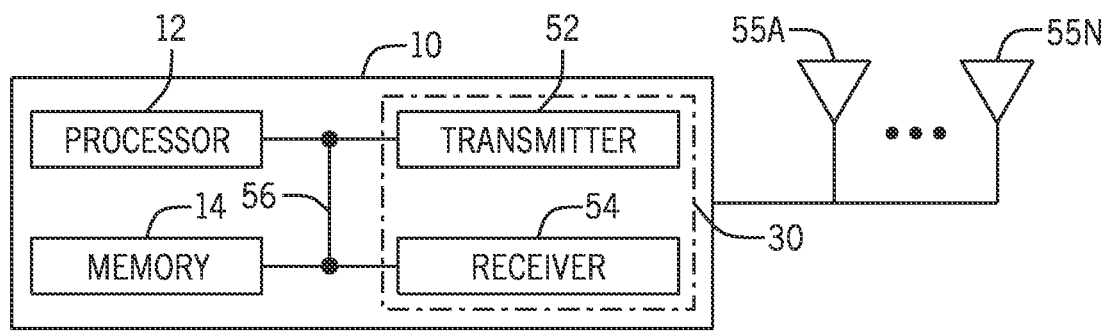
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
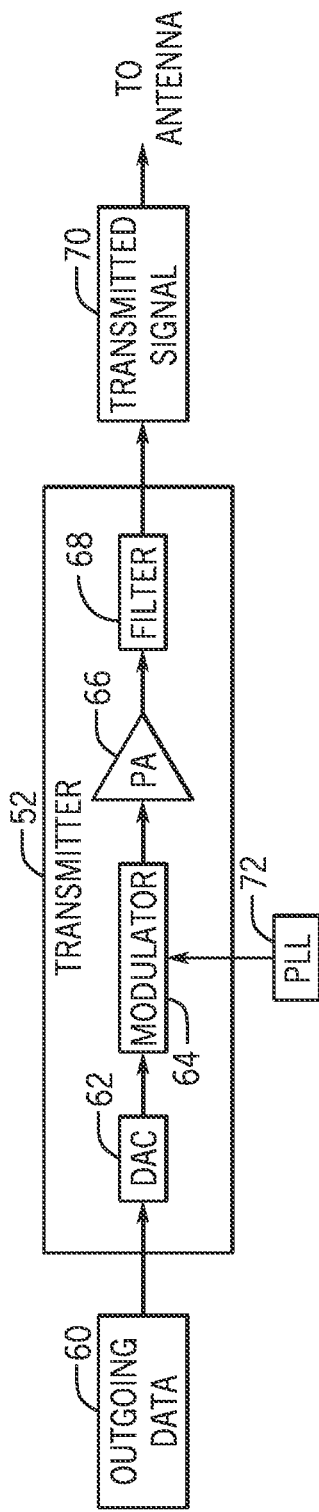
FIG. 3 is a schematic diagram of a transmitter of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 receives the modulated signal from the modulator 64. The power amplifier 66 may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted signal 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter.

The power amplifier 66 and/or the filter 68 may be referred to as part of a radio frequency front end (RFFE), and more specifically, a transmit front end (TXFE) of the electronic device 10. A phase-locked loop (PLL) 72 may be coupled to the transceiver 30 and may generate a high frequency clock to upconvert or downconvert a signal between baseband and the antennas 55. For instance, the PLL 72 may be coupled between the transmitter 52 and the antennas 55 to upconvert the signal from baseband to the antennas 55. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or other digital up converter besides the PLL 72. As another example, the transmitter 52 may not include the filter 68 if the power amplifier 66 outputs the amplified signal in or approximately in a desired frequency range (such that filtering of the amplified signal may be unnecessary).

Figure 4:
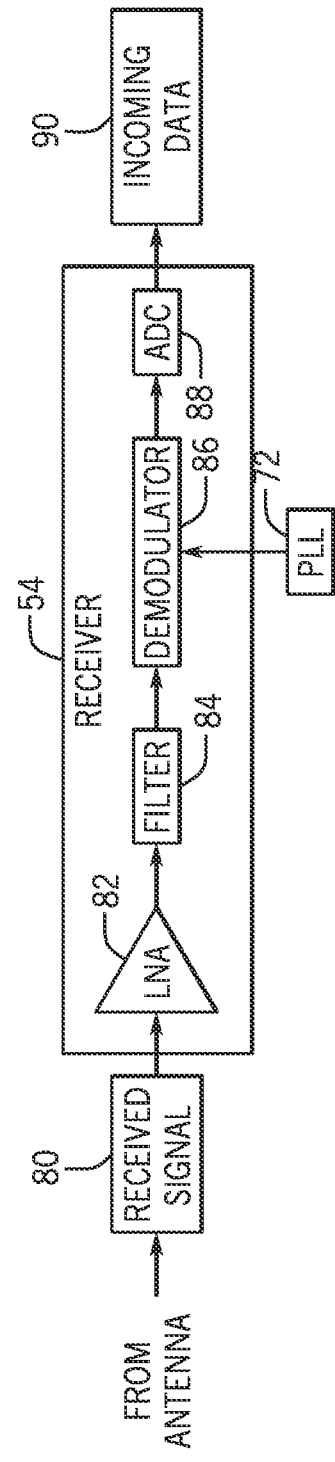
FIG. 4 is a schematic diagram of a receiver of the electronic device of FIG. 1, according to embodiments of the present disclosure.

FIG. 4 is a schematic diagram of the receiver 54 (e.g., receive circuitry), according to embodiments of the present disclosure. As illustrated, the receiver 54 may receive received signal 80 from the one or more antennas 55 in the form of an analog signal. The PLL 72 may be coupled to the input of the receiver 54 to downconvert the signal from the antennas 55 to baseband. A low noise amplifier (LNA) 82 may amplify the received analog signal to a suitable level for the receiver 54 to process. A filter 84 (e.g., filter circuitry and/or software) may remove undesired noise from the received signal, such as cross-channel interference. The filter 84 may also remove additional signals received by the one or more antennas 55 that are at frequencies other than the desired signal. The filter 84 may include any suitable filter or filters to remove the undesired noise or signals from the received signal, such as a bandpass filter, a bandstop filter, a low pass filter, a high pass filter, and/or a decimation filter. The low noise amplifier 82 and/or the filter 84 may be referred to as part of the RFFE, and more specifically, a receiver front end (RXFE) of the electronic device 10.

A demodulator 86 may remove a radio frequency carrier signal and/or extract a demodulated signal (e.g., an envelope signal) from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received signal 80 via the one or more antennas 55. For example, the receiver 54 may include a mixer and/or a digital down converter.

Figure 5:
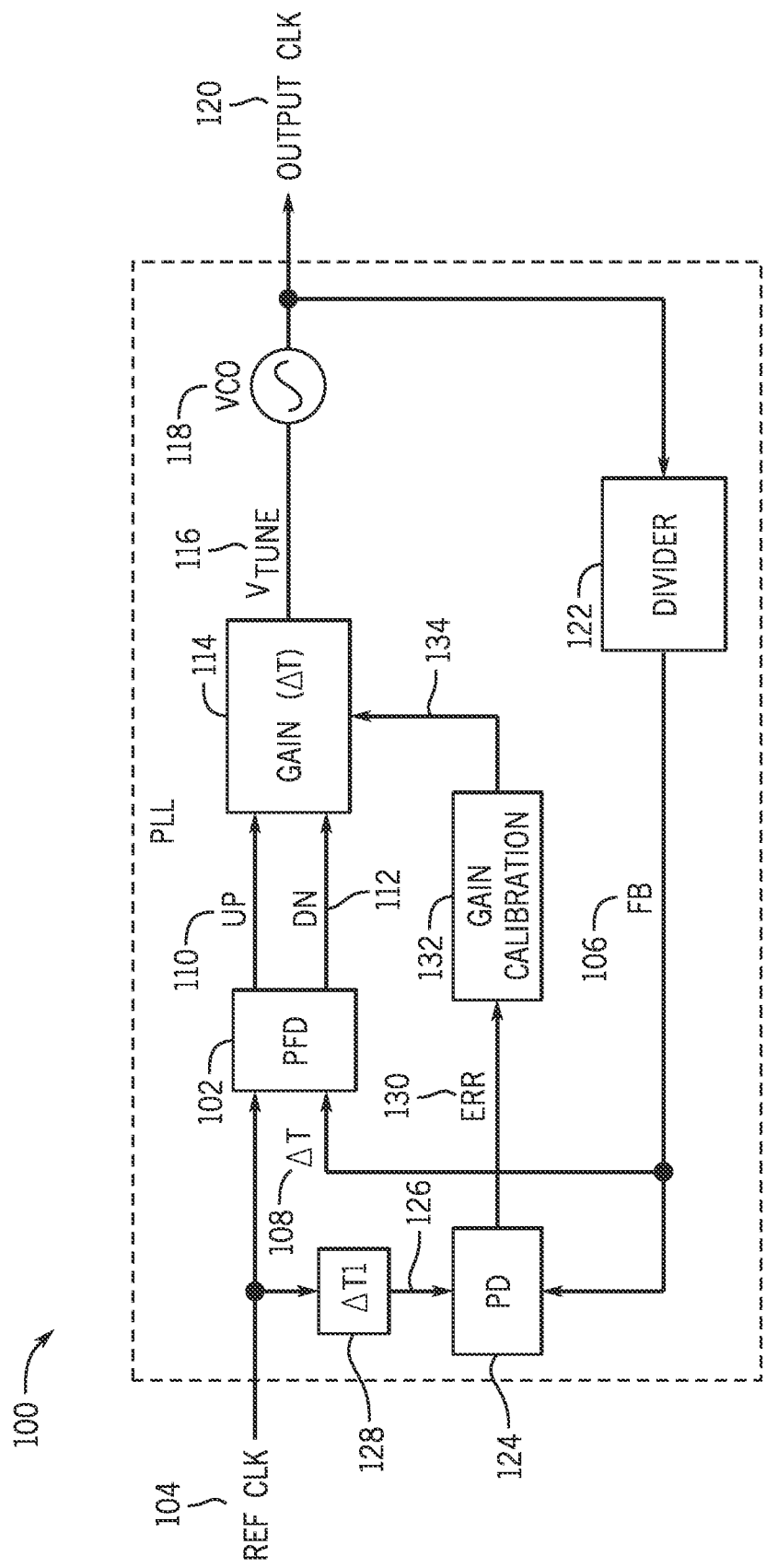
FIG. 5 is a block diagram of a PLL that performs gain calibration.

FIG. 5 is a block diagram of a PLL 100 that performs gain calibration, according to embodiments of the present disclosure. The PLL 100 includes a phase frequency detector 102 that receives a reference clock signal 104 (e.g., output by a clock signal generator) and a feedback signal 106 as inputs. The phase frequency detector 102 may compare the reference clock signal 104 and the feedback signal 106 to determine a time offset 108 (e.g., a static time offset, a phase offset) between the reference clock signal 104 and the feedback signal 106. The phase frequency detector 102 may measure the actual (e.g., dynamic) time difference between the reference clock signal 104 and the feedback signal 106 and provide the time difference to gain circuitry 114 to attenuate the phase noise of a voltage-controlled oscillator (VCO) 118. The time offset 108 may be referred to as the static time offset because, as will be discussed in greater detail below, an average/static time offset may be determined to carry out gain calibrations and duty cycle calibrations. Based on the time offset 108, the phase frequency detector 102 may send an up signal 110 or a down signal 112 to gain circuitry 114. The gain circuitry 114 may adjust the gain of the PLL 100 (e.g., increase the gain or decrease the gain) to reduce or eliminate phase noise of the PLL 100. In particular, the gain circuitry 114 outputs a VTUNE signal 116 to the VCO 118, which outputs an output clock signal 120 that is adjusted by the VTUNE signal 116 from the PLL 100. The PLL 100 includes a divider 122 that receives the output clock signal 120 from the VCO 118 and outputs the feedback signal 106.

The gain circuitry 114 may operate to reduce or minimize the phase noise of the reference clock signal 104 and the VCO 118. However, as previously mentioned, variations in PVT may cause loop gain variations that may cause a variation of the noise transfer function of the reference clock and the VCO 118, which may result in suboptimal PLL phase noise performance. To reduce or eliminate PLL gain variation across PVT, the loop gain of the PLL 100 may be calibrated. However, it may be impracticable to measure the loop gain of the PLL 100. Accordingly, it may be beneficial to implement the PLL 100 with a gain function that is a function of an input phase offset time. The input phase offset time may have a phase noise performance that remains consistent across PVT variations, such that the loop gain of the PLL 100 may be determined via the input phase offset time, enabling calibration of the PLL 100 loop gain without direct measurement of the loop gain.

To achieve a gain function that is a function of the input phase offset time with a phase noise performance that remains consistent across PVT variations, the PLL 100 is implemented with a phase detector 124 that receives as inputs a delayed reference signal 126 (e.g., delayed by a time offset) and the feedback signal 106. The time offset may be referred to as a target time offset 128, as the time offset 128 includes a desired time offset for a PLL (e.g., 100). The target time offset 128 may be selected to delay the reference clock signal 104 such that the reference clock signal 104 achieves a desired phase. It should be noted that while the target time offset 128 is illustrated as between the reference clock signal 104 and the phase detector 124, in some embodiments the target time offset 128 may be disposed between the feedback signal and the phase detector 124. In still other embodiments, the target time offset 128 may be split between the two lines, such that a portion of the target time offset is between the reference clock signal 104 and the phase detector 124 and another portion is between the feedback signal 106 and the phase detector 124.

As will be discussed in greater detail below with respect to FIG. 6, the phase detector 124 may output an error signal 130 based on a mismatch between a static time offset (e.g., the time offset 108) and a target time offset the target time offset 128 indicative of a phase mismatch, and gain calibration circuitry 132 may send a gain calibration output signal 134 to adjust the operating parameters of the gain circuitry 114 based on the error signal 130.

Figure 6:
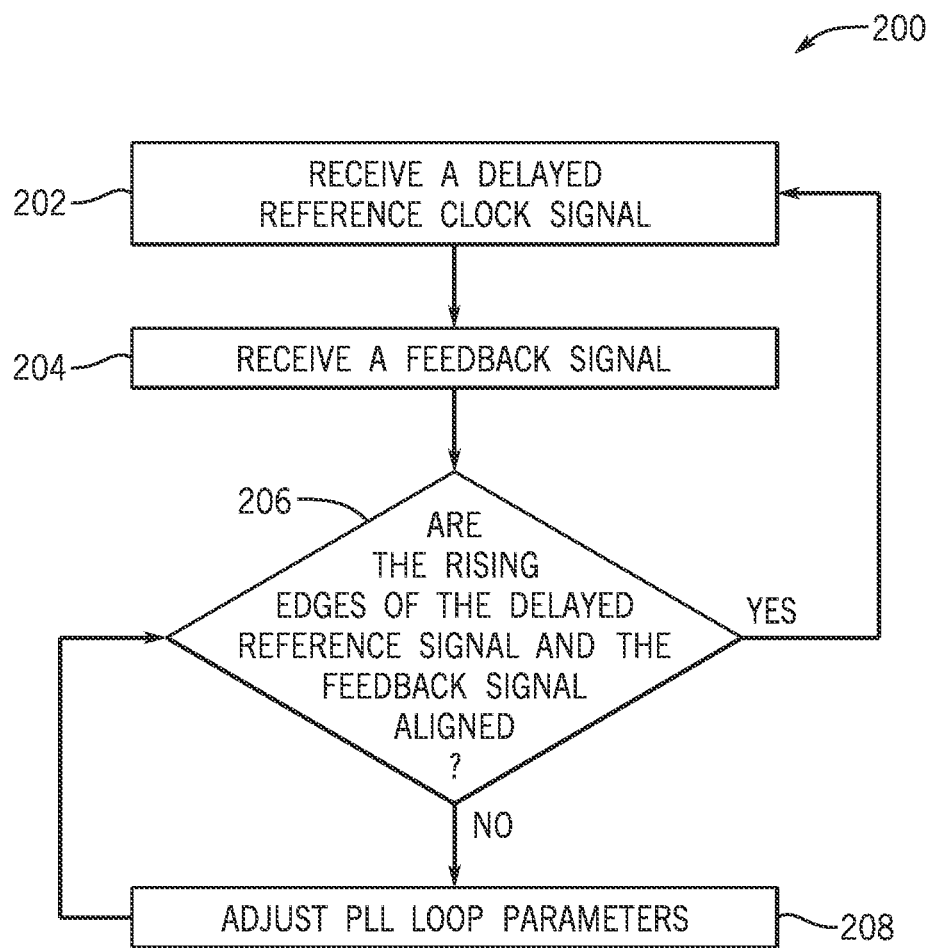
FIG. 6 is a flowchart of a method for calibrating PLL loop gain of the PLL of FIG. 5 to reduce or minimize PLL phase noise due to process, voltage, and temperature (PVT) variations.

FIG. 6 is a flowchart of a method 200 for calibrating PLL loop gain to reduce or minimize PLL phase noise due to PVT variations, according to embodiments of the present disclosure. Any suitable device (e.g., a controller) that may control components of the electronic device 10, such as the processor 12, may perform the method 200. In some embodiments, the method 200 may be implemented by executing instructions stored in a tangible, non-transitory, computer-readable medium, such as the memory 14 or storage 16, using the processor 12. For example, the method 200 may be performed at least in part by one or more software components, such as an operating system of the electronic device 10, one or more software applications of the electronic device 10, and the like. While the method 200 is described using steps in a specific sequence, it should be understood that the present disclosure contemplates that the described steps may be performed in different sequences than the sequence illustrated, and certain described steps may be skipped or not performed altogether.

In process block 202, the phase detector 124 receives the delayed reference signal 126. In process block 204, the phase detector 124 receives the feedback signal 106. In query block 206, the phase detector 124 determines if a rising edge of the feedback signal 106 is aligned with a rising edge of the delayed reference signal 126. The rising edges of the feedback signal 106 aligning with the rising edges of the delayed reference signal 126 indicate that the feedback signal 106 and the delayed reference signal 126 are in phase. The feedback signal 106 may be in phase with the delayed reference signal 126 when the time offset 108 (e.g., a static time offset) is equal to the target time offset 128. That is, when the PLL 100 is operating at the target time offset 128, the feedback signal 106 will be in phase with the delayed reference signal 126. For example, if the time offset 108 is equal to the target time offset 128, the PLL 100 may operate with reduced or minimized phase noise. Under this condition, the digital signals associated with the feedback signal 106 and the delayed reference signal 126 may have rising edges that are aligned at the input of the phase detector 124, resulting in an error signal 130 that includes a stream of a random sequence of +1s and −1s that average out to 0 at the gain calibration circuitry 132. The gain calibration circuitry 132 may extract the average value of the error signal 130 as an input value. Having an average value of 0 may result in the gain calibration circuitry 132 maintaining loop gain parameters of the PLL 100 (e.g., refraining from adjusting the loop gain parameters of the gain circuitry 114), as there is no mismatch between the time offset 108 and the target time offset 128. Accordingly, if, in query block 206, the phase detector 124 determines that the rising edges of the feedback signal 106 are aligned with the rising edges of the delayed reference signal 126, the PLL 100 may return to the process block 202. However, if in the query block 206 the phase detector 124 determines that the rising edges of the feedback signal 106 are not aligned with the rising edges of the delayed reference signal 126 (e.g., determines that the feedback signal 106 is out of phase with the delayed reference signal 126), in process block 208, the gain calibration circuitry 132 outputs the gain calibration output signal 134 to adjust the loop gain parameters of the gain circuitry 114. The adjusted loop gain parameters may cause a phase adjustment of the phase of the feedback signal 106. The gain calibration circuitry 132 may iteratively adjust the loop gain parameters until the feedback signal 106 is in phase with the delayed reference signal 126 (e.g., until the rising edges of the feedback signal 106 are aligned with the rising edges of the delayed reference signal 126). In this manner, the method 200 calibrates PLL 100 loop gain to reduce or minimize PLL phase noise due to PVT variations.

Figure 7:
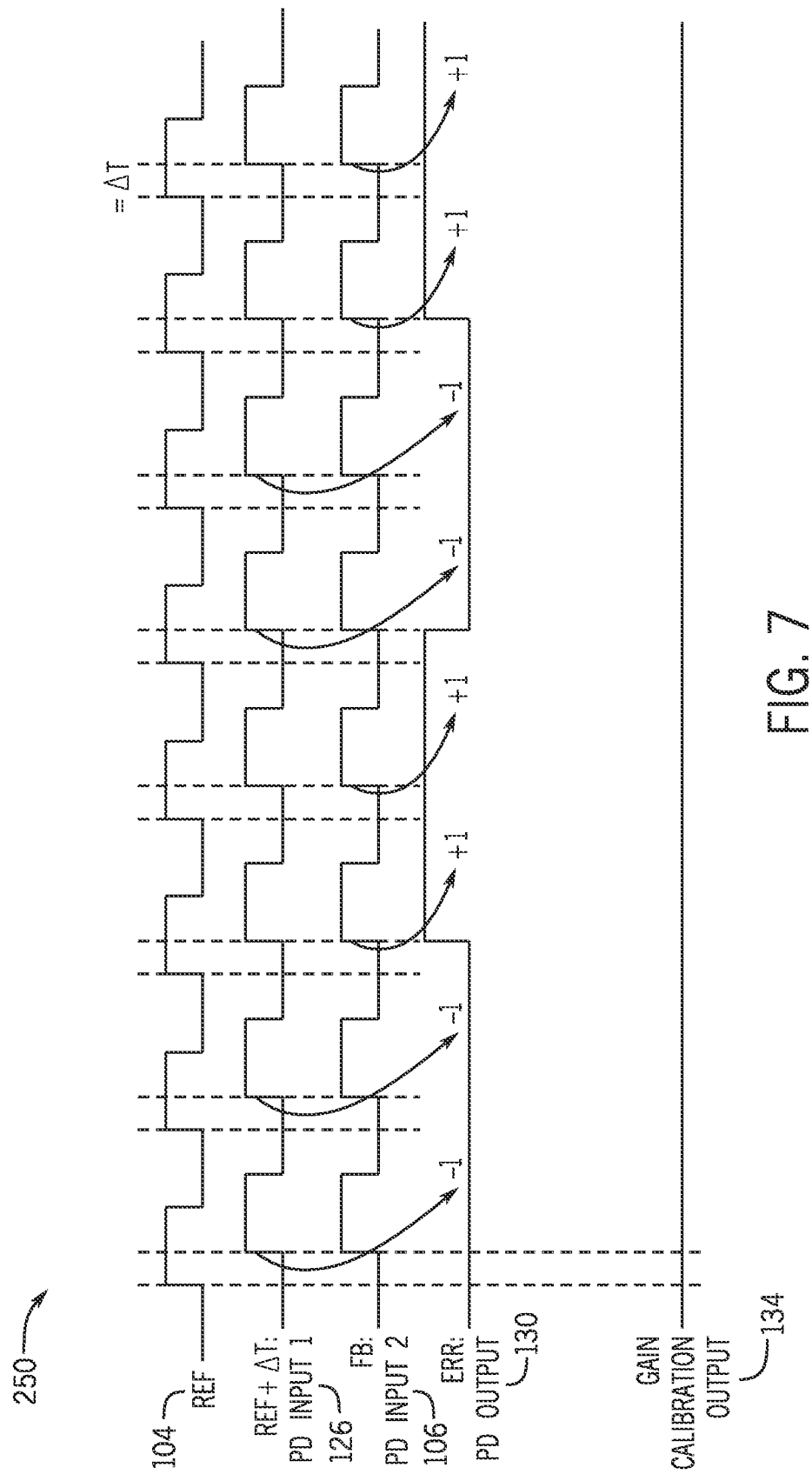
FIG. 7 is a timing diagram of operation of the PLL of FIG. 5 when a first time offset is equal to a second time offset, according to embodiments of the present disclosure.

FIG. 7 is a timing diagram 250 of PLL 100 operation when the time offset 108 is equal to the target time offset 128, according to an embodiment of the present disclosure. The timing diagram includes pulses corresponding to the reference clock signal 104, the delayed reference signal 126, the feedback signal 106, the error signal 130 (e.g., the phase detector 124 output) and the gain calibration output signal 134. As may be observed from the timing diagram 250, when the time offset 108 is equal to the target time offset 128, the rising edges of the delayed reference signal 126 and the feedback signal 106 are aligned, which results in the error signal 130 outputting an even number of +1s and −1s. It should be noted that, as the gain calibration circuitry 132 extracts an average of the direct current (DC) value of the error signal 130, not each and every rising edge may be aligned between the delayed reference signal 126 and the feedback signal 106, but they, on average may be aligned (e.g., such that there are an even number of +1s and −1s extracted by the gain calibration circuitry 132). Due to the even number of +1s and −1s, the gain calibration output signal 134 does not change, as there is no gain compensation needed to be applied to the gain circuitry 114.

Figure 8:
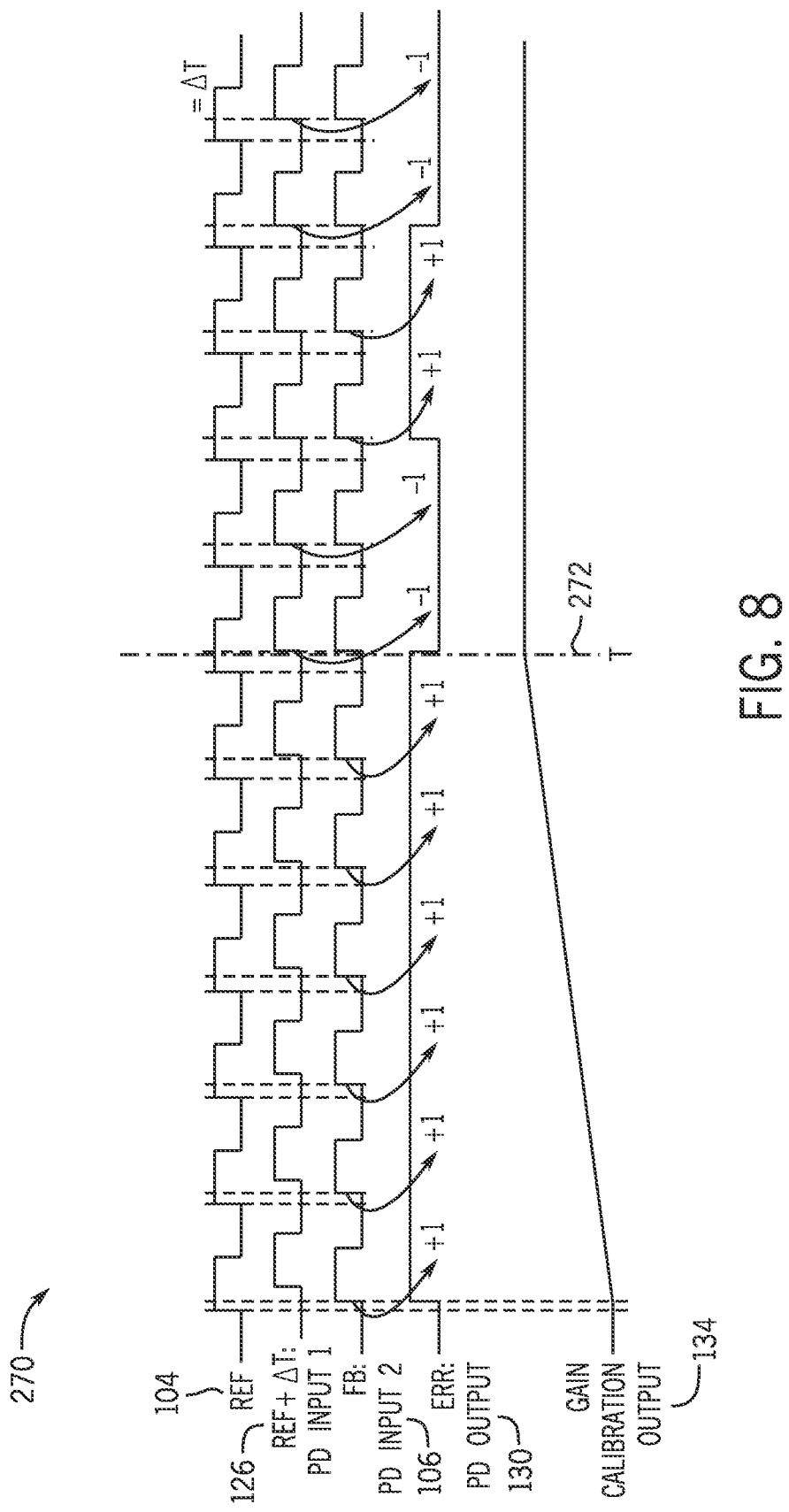
FIG. 8 is a timing diagram of operation of the PLL of FIG. 5 when the first time offset is unequal to the second time offset, according to embodiments of the present disclosure.

FIG. 8 is a timing diagram 270 of PLL 100 operation when the time offset 108 is unequal to the target time offset 128, according to an embodiment of the present disclosure. As may be observed from the timing diagram 270, the mismatch between the time offset 108 and the target time offset 128 results in the error signal 130 outputting an uneven number of +1s and −1s. The gain calibration circuitry 132 receives the error signal 130 and extracts the average value of the error signal 130. The average value of the error signal 130 is nonzero until time T 272. Prior to the time T 272, the gain calibration output signal 134 changes to adjust PLL loop parameters. Adjusting the PLL loop parameters may include increasing or decreasing the delay of the gain circuitry 114. After the time T 272, the PLL 100 loop parameters have been adjusted such that the time offset 108 again is equal to the target time offset 128, the error signal 130 includes an even number of +1s and −1s, the average of the error signal 130 returns to 0, and the gain calibration output signal 134 returns to steady state, making no adjustments to the gain circuitry 114 until the time offset 108 and the target time offset 128 become misaligned. That is, steady state may include a state wherein operation of a PLL (e.g., 100) is not being adjusted as the feedback signal 106 and the delayed reference signal 126 are in phase and the PLL is operating as desired. For example, when the PLL 100 is in steady state, the loop gain parameters of the PLL 100 are not being adjusted.

Figure 9:
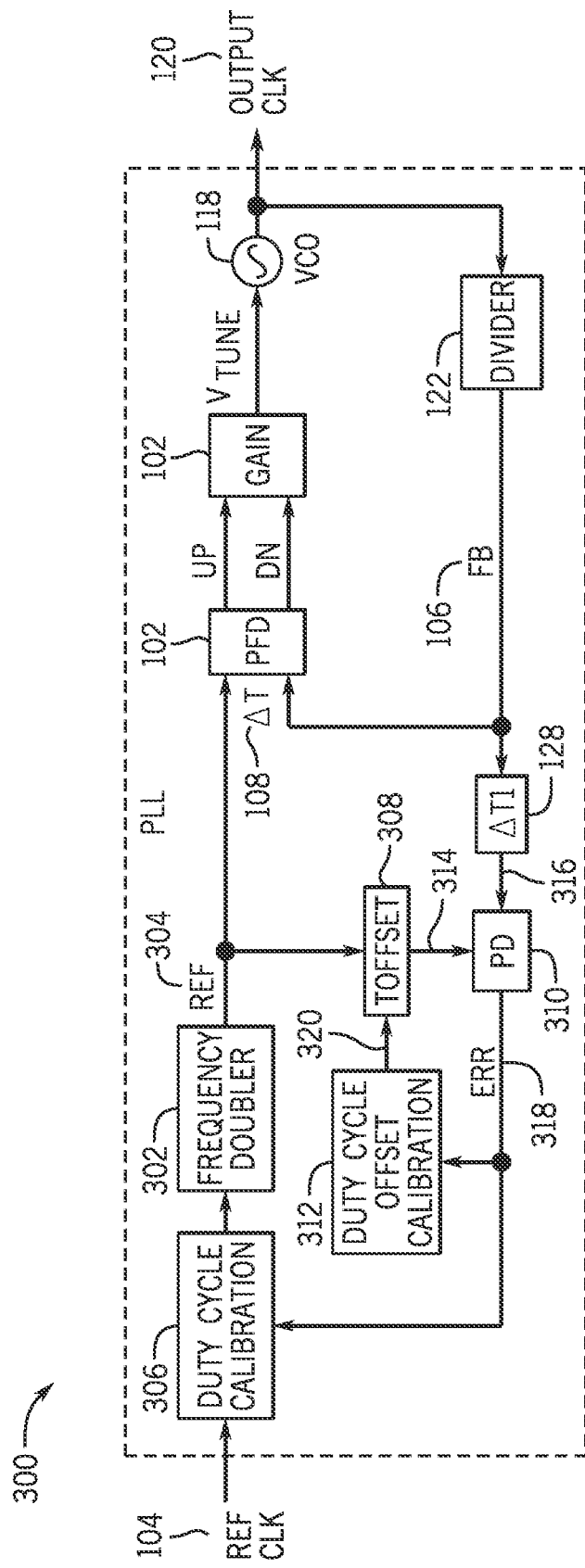
FIG. 9 is a block diagram of a PLL that performs duty cycle offset calibration, according to embodiments of the present disclosure.

FIG. 9 is a block diagram of a PLL 300 configured to perform duty cycle offset calibration, according to embodiments of the present disclosure. The PLL 300 includes the phase frequency detector 102, the gain circuitry 114, the VCO 118, and the divider 122 as discussed with respect to FIG. 5. In some cases, the PLL 300 may operate with reduced or minimized noise and increased or maximized power efficiency at higher reference clock frequencies. In particular, frequency doubling circuitry 302 is implemented to reduce or minimize noise and increase or maximize power efficiency of the PLL 300. The frequency doubling circuitry 302 outputs a higher frequency reference signal 304, which has a frequency greater than that of the reference clock signal 104. However, the frequency doubling circuitry 302 may introduce high reference transients (e.g., reference spurs) if the clock duty cycle of the PLL 300 deviates from a desired duty cycle (e.g., a desired duty cycle of 25%, 50%, 75%, or any other desirable duty cycle target). To prevent or mitigate this reference transient, duty cycle calibration circuitry 306 may be implemented.

Similar to the PLL 100 discussed with respect to FIG. 5, the PLL 300 includes the time offset 108 between the path of the reference clock signal 104 and the path of the feedback signal 106. As discussed with respect to the PLL 100, the time offset 108 may vary with PVT variations, causing the time offset 108 to become misaligned with the target time offset 128. As the time offset 108 varies with PVT variations, the accuracy of duty cycle error detection via the duty cycle calibration circuitry 306 may be reduced, negatively impacting performance of the PLL 300. In some cases, the time offset 108 may be directly compensated or corrected to mitigate the impact of PVT variance. However, correcting the time offset 108 directly may cause disturbances at the output 120 of the PLL 300, which may degrade overall PLL 300 performance.

It should be noted that while the target time offset 128 is illustrated as being disposed between the feedback signal 106 and the phase detector 310, in some embodiments, the target time offset 128 may be applied at a different input of the phase detector 310 (e.g., a delay element that provides the target time offset 128 may be disposed between the phase detector 124 and delay circuitry 308). In still other embodiments, the target time offset 128 may be split between the two lines, such that a portion of the target time offset is between the feedback signal 106 and the phase detector 310 and another portion is between the delay circuitry 308 and the phase detector 310.

To enable compensation for PVT variance while reducing or eliminating associated PLL 300 performance impact, a duty cycle offset calibration loop may be implemented. The duty cycle calibration loop may include delay circuitry 308 (e.g., a delay element), a phase detector 310, and duty cycle offset calibration circuitry 312. The phase detector 310 receives as input a delayed reference signal 314, which includes a delay or time offset to the higher frequency reference signal 304 provided via the delay circuitry 308. The phase detector 310 also receives as input a delayed feedback signal 316, wherein the delay of the delayed feedback signal 316 is provided by the target time offset 128. It should be noted that while the target time offset 128 is discussed as including the same target time offset 128 with respect to the PLL 100, in some embodiments the target time offset of the PLL 300 may include a different time offset than the target time offset of the PLL 100. The phase detector 310 may determine whether rising edges of the delayed reference signal 314 and the delayed feedback signal 316 are aligned (e.g., determine whether the delayed reference signal 314 and the delayed feedback signal 316 are in-phase) and, if the rising edges are not aligned (e.g., if whether the delayed reference signal 314 and the delayed feedback signal 316 are not in-phase), send an error signal 318 to the duty cycle offset calibration circuitry 312, which sends a duty cycle offset calibration signal 320 to the delay circuitry 308 to adjust the delay provided to the delayed reference signal to compensate for the phase mismatch between the delayed reference signal 314 and the delayed feedback signal 316.

Figure 10:
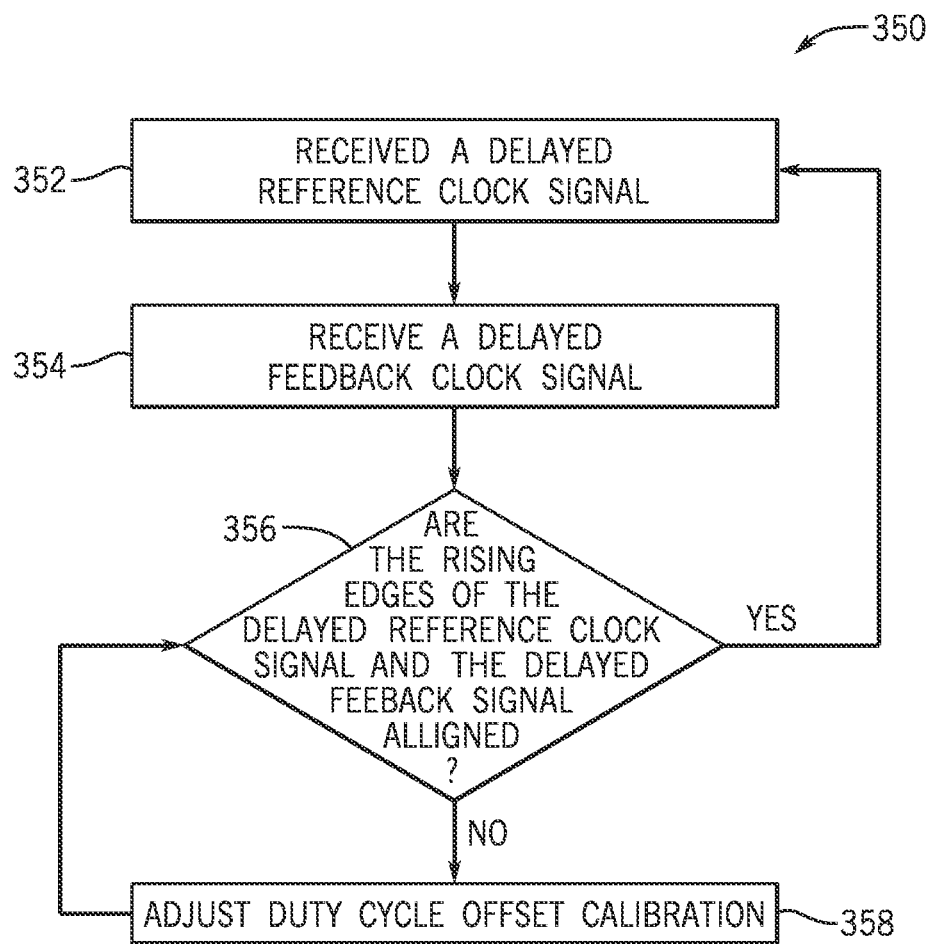
FIG. 10 is a flowchart of a method for calibrating duty cycle offset of the PLL of FIG. 9 to reduce or minimize PLL performance impact due to PVT variations, according to embodiments of the present disclosure.

FIG. 10 is a flowchart of a method 350 for calibrating duty cycle offset of the PLL 300 to reduce or minimize PLL performance impact due to PVT variations, according to embodiments of the present disclosure. Any suitable device (e.g., a controller) that may control components of the electronic device 10, such as the processor 12, may perform the method 350. In some embodiments, the method 350 may be implemented by executing instructions stored in a tangible, non-transitory, computer-readable medium, such as the memory 14 or storage 16, using the processor 12. For example, the method 350 may be performed at least in part by one or more software components, such as an operating system of the electronic device 10, one or more software applications of the electronic device 10, and the like. While the method 350 is described using steps in a specific sequence, it should be understood that the present disclosure contemplates that the described steps may be performed in different sequences than the sequence illustrated, and certain described steps may be skipped or not performed altogether.

In process block 352, the phase detector 310 receives the delayed reference signal 314. As discussed above, the delay of the delayed reference signal 314 is provided by the delay circuitry 308. At an initial time t0, the delay provided by the delay circuitry 308 may be equal to 0, such that there is no delay provided to the reference signal 314. Thus, at the initial time t0, the delayed reference signal 314 is equal to the higher frequency reference signal 304. In process block 354, the phase detector 310 receives the delayed feedback signal 316. As discussed above, the delay of the delayed feedback signal 316 is provided by the target time offset 128. In query block 356, the phase detector 310 determines whether the rising edges of the delayed reference signal 314 and the rising edges of the delayed feedback signal 316 are aligned. If the rising edges of the delayed reference signal 314 and the delayed feedback signal 316 are aligned (e.g., the delayed reference signal and the delayed feedback signal are in-phase), the phase detector 310 outputs the error signal 318 which includes, under this condition, an even number of +1s and −1s. The duty cycle offset calibration circuitry 312 extracts an average of the DC value of the error signal 318 and, as the average is equal to 0, determines that there is no error, and the duty cycle offset calibration circuitry 312 does not adjust the delay circuitry 308, and thus the time offset remains at 0 and the delayed reference signal 314 remains equal to the higher frequency reference signal 304.

However, if the rising edges of the delayed reference signal 314 and the delayed feedback signal 316 are not aligned (e.g., the delayed reference signal and the delayed feedback signal are not in-phase), the error signal 318 then includes an uneven number of +1s and −1s. In process block 358, the duty cycle offset calibration circuitry 312 extracts an average of the DC value of the error signal 318 and, as the average will not be equal to 0, determines that there is an error, and adjusts the delay of the delay circuitry 308 to adjust the delay of the delayed reference signal 314 and compensate for the phase mismatch between the delayed reference signal 314 and the delayed feedback signal 316 are in-phase. From the query block 356, the phase detector 310 again determines whether the edges of the delayed reference signal 314 and the delayed feedback signal 316 are aligned, and the method 350 may iteratively repeat until the edges are aligned. In this manner, the method 350 may calibrate the duty cycle offset of the PLL 300 to reduce or minimize PLL performance impact due to PVT variations.

Figure 11:
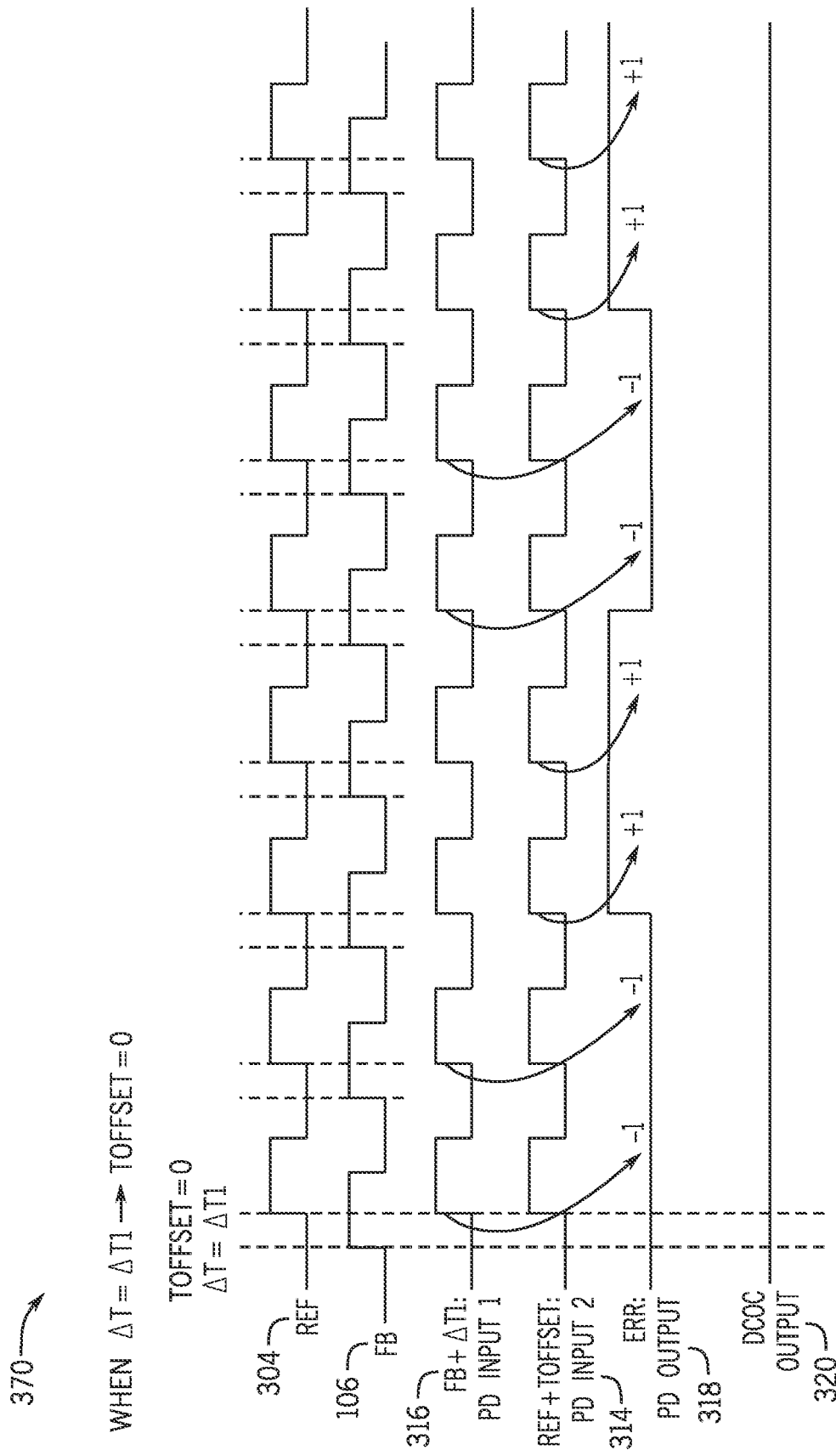
FIG. 11 is a timing diagram illustrating operation of the PLL of FIG. 9 under steady state conditions, according to embodiments of the present disclosure.

FIG. 11 is a timing diagram 370 illustrating operation of the PLL 300 under steady state conditions, according to an embodiment of the present disclosure. As may be observed from the timing diagram 370, when the rising edges of the delayed feedback signal 316 and the rising edges of the delayed reference signal 314 are aligned, the error signal 318 outputs an even number of +1s and −1s. It should be noted that, as the duty cycle offset calibration circuitry 312 extracts an average of the DC value of the error signal 318, not each and every rising edge may be aligned between the delayed reference signal 314 and the delayed feedback signal 316, but they, on average may be aligned (e.g., such that there are an even number of +1s and −1s extracted by duty cycle offset calibration circuitry 312). Due to the even number of +1s and −1s, the duty cycle offset calibration circuitry 312 maintains duty cycle parameters (e.g., refrains from applying a duty-cycle adjustment), and there is no change to the delay circuitry 308.

Figure 12:
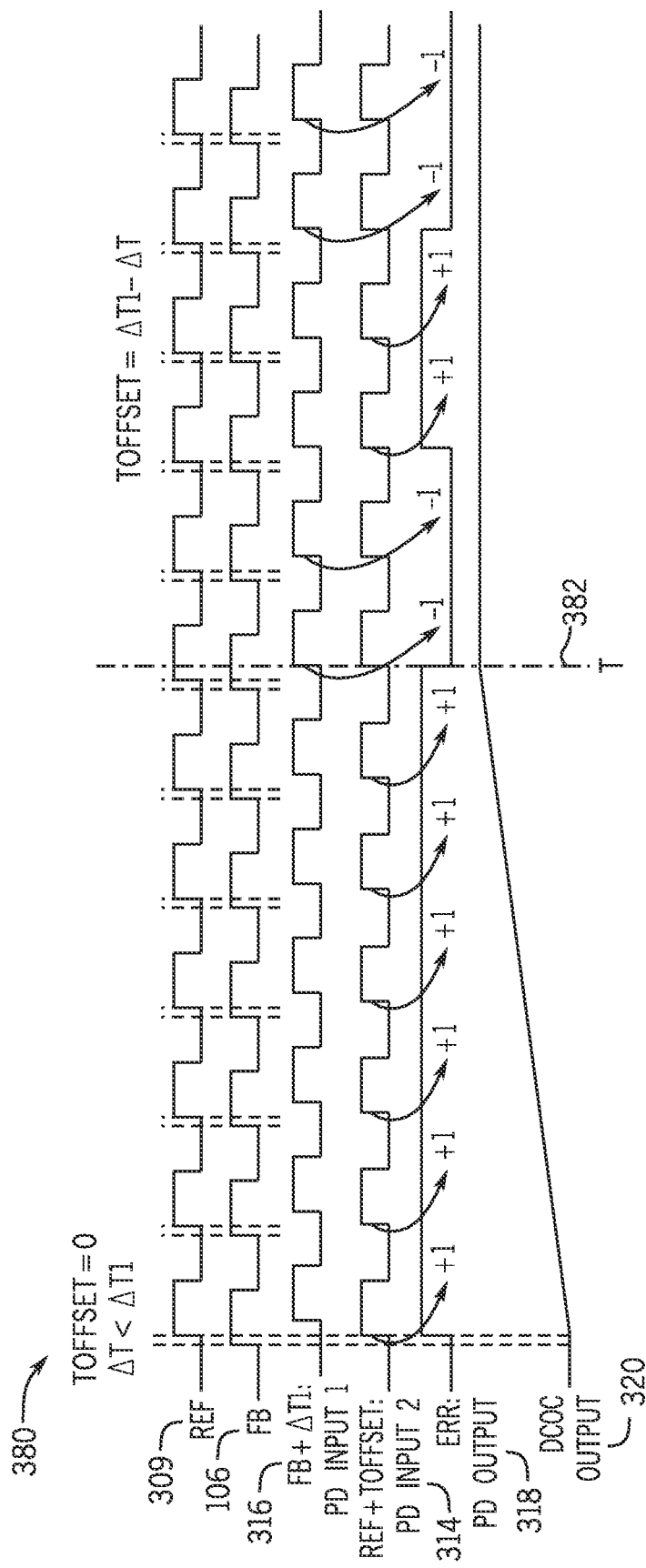
FIG. 12 is a timing diagram of operation of the PLL of FIG. 9 during duty cycle calibration, according to embodiments of the present disclosure.

FIG. 12 is a timing diagram 380 of operation of the PLL 300 during duty cycle calibration, according to embodiments of the present disclosure. As may be observed from the timing diagram 380, when the rising edges of the delayed feedback signal 316 and the rising edges of the delayed reference signal 314 are not aligned, the error signal 318 outputs an uneven number of +1s and −1s. When the duty cycle offset calibration circuitry 312 extracts an average of the DC value of the error signal 318, the average of the DC value of the error signal 318 will be nonzero due to the misalignment. The nonzero error signal 318 causes the duty cycle offset calibration circuitry 312 to adjust the value of the duty cycle offset calibration signal 320, which in turn adjusts the delay circuitry 308, increasing or decreasing the delay provided to the delayed reference signal 314 until the delayed reference signal 314 and the delayed feedback signal 316 are realigned and the average error signal 318 returns to 0 at time T 382.

Figure 13:
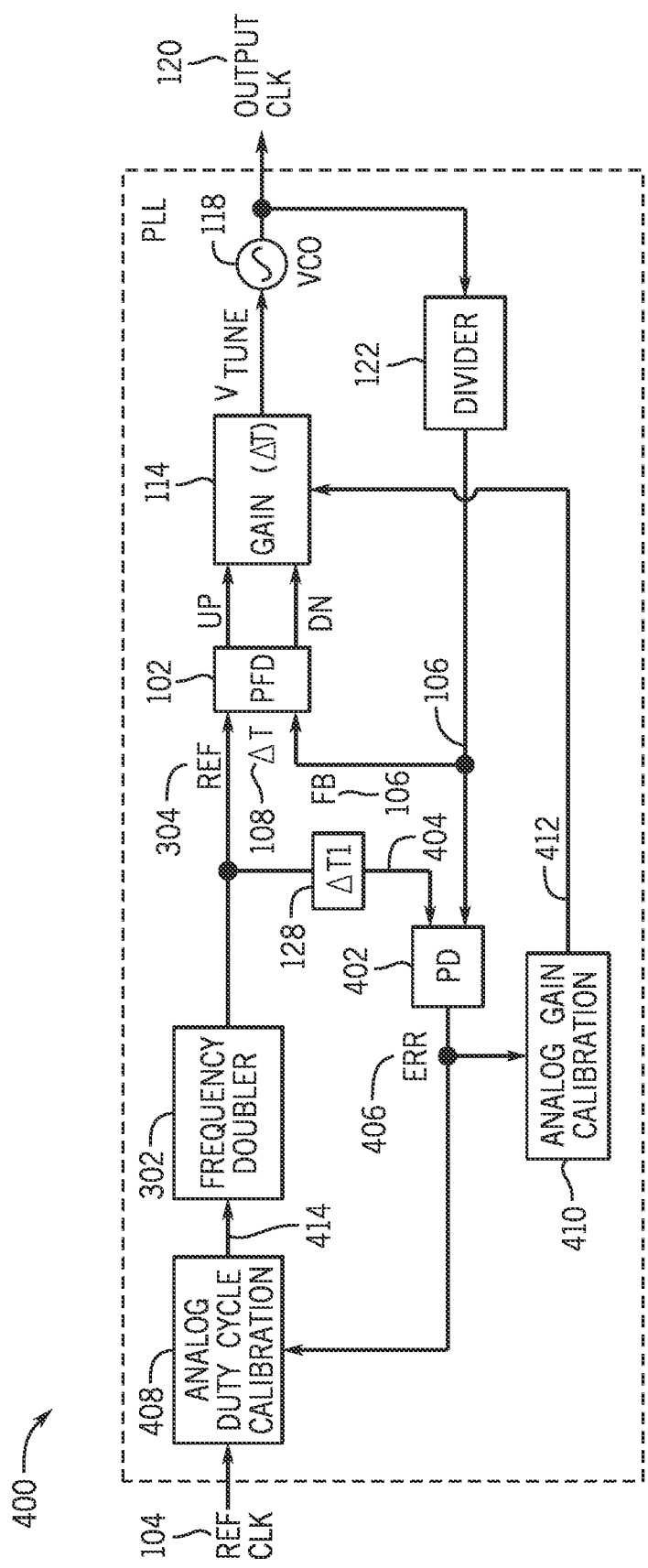
FIG. 13 is a block diagram of a PLL that provides an analog duty cycle calibration and an analog gain calibration using a single phase detector, according to embodiments of the present disclosure.

In some instances, it may be desirable to determine and perform loop gain and duty cycle gain calibration concurrently or simultaneously although so may in some cases result in prohibitive complexity and/or area/power penalty. However, by sharing a single phase detector between gain calibration circuitry and loop gain calibration circuitry, both calibrations may be concurrently or simultaneously performed without incurring prohibitive area or power penalty. FIG. 13 is a block diagram of a PLL 400 that provides an analog duty cycle calibration and an analog gain calibration using a single phase detector 402, according to embodiments of the present disclosure. The PLL 400 includes the PFD 102, the gain circuitry 114, the VCO 118, and the divider 122, as discussed above. As previously stated, the loop gain of the gain circuitry 114 may be a function of input phase offset time (e.g., the time offset 108).

The phase detector 402 may operate similarly as the phase detector 124 and the phase detector 310 described above. To provide gain calibration as described with respect to the PLL 100, the phase detector 402 may receive as inputs a delayed reference signal 404 and the feedback signal 106. The phase detector 402 may output the error signal 406 that indicates whether the delayed reference signal 404 and the feedback signal 106 align. If the delayed reference signal 404 and the feedback signal 106 have rising edges that align with each other (e.g., such as when the PLL 400 is operating at the target loop gain and the time offset 108 is equal to target time offset 128), analog duty cycle calibration circuitry 408 and analog gain calibration circuitry 410 may receive the error signal 406 from the phase detector 402 and extract an average DC value of the error signal 406. Under the condition that the delayed reference signal 404 and the feedback signal 106 are aligned, the error signal 406 will include a bit stream with an even number of +1s and −1s, and thus the average value of the error signal 406 will equal 0. As the average value of the error signal will equal 0, the analog duty cycle calibration circuitry 408 and the analog gain calibration circuitry 410 may not change the loop parameters of the gain circuitry 114, and thus may not change the loop parameters of the PLL 400.

However, if the phase detector 402 determines that the delayed reference signal 404 and the feedback signal 106 are not aligned (e.g., such as when the PLL 400 is not operating at the target loop gain due to PVT variations and that the time offset 108 does not equal the target time offset 128), the phase detector may output the error signal 406 with an uneven number of +1s and −1s from which the analog duty cycle calibration circuitry 408 and the analog gain calibration circuitry 410 may extract an average DC value. The analog gain calibration circuitry 410 may adjust the loop parameters of the gain circuitry 114 based on the value of the error signal 406 and the analog duty cycle calibration circuitry 408 may adjust the duty cycle of the PLL 400 based on the sign (e.g., either positive or negative) of the error signal 406. With one phase detector 402, the mismatch determined at the phase detector 402 is common between gain calibration and duty cycle calibration. In this way, gain calibration is performed and effectively decreases or removes a detection mismatch from the phase detector 402 and achieves increased precise duty cycle calibration accuracy.

Figure 14:
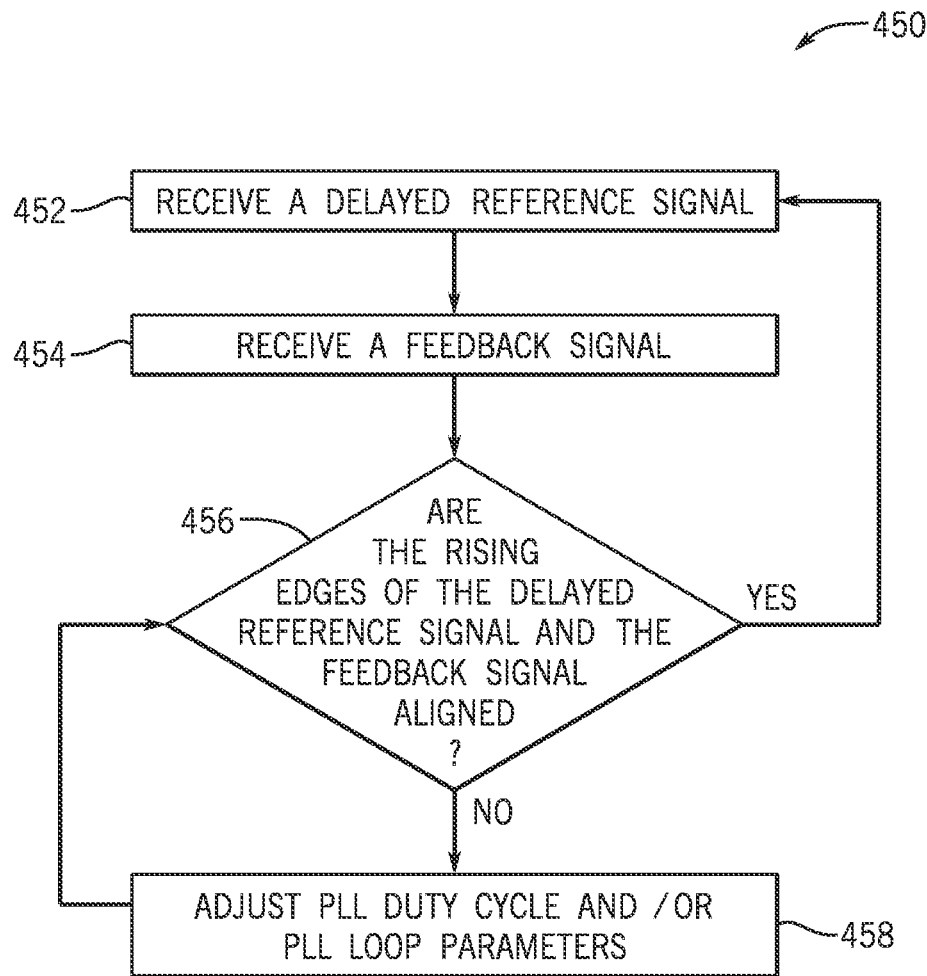
FIG. 14 is a flowchart of a method for performing analog loop gain and duty cycle calibration of the PLL of FIG. 13 to reduce or minimize PLL phase noise due to PVT variations, according to embodiments of the present disclosure.

FIG. 14 is a flowchart of a method 450 for performing analog loop gain and duty cycle calibration for the PLL 400 to reduce or minimize PLL phase noise due to PVT variations, according to embodiments of the present disclosure. Any suitable device (e.g., a controller) that may control components of the electronic device 10, such as the processor 12, may perform the method 450. In some embodiments, the method 450 may be implemented by executing instructions stored in a tangible, non-transitory, computer-readable medium, such as the memory 14 or storage 16, using the processor 12. For example, the method 450 may be performed at least in part by one or more software components, such as an operating system of the electronic device 10, one or more software applications of the electronic device 10, and the like. While the method 450 is described using steps in a specific sequence, it should be understood that the present disclosure contemplates that the described steps may be performed in different sequences than the sequence illustrated, and certain described steps may be skipped or not performed altogether.

In process block 452, the phase detector 402 receives the delayed reference signal 404. In process block 454, the phase detector 402 receives the feedback signal 106. In query block 456, the analog duty cycle calibration circuitry 408 and/or the analog gain calibration circuitry 410 determines if a rising edge of the feedback signal 106 is aligned with a rising edge of the delayed reference signal 404. This may occur when the time offset 108 is equal to the target time offset 128. That is, when the PLL 400 is operating with the target time offset 128, the feedback signal 106 will be in phase with the delayed reference signal 404. For example, if the time offset 108 is equal to the target time offset 128, the PLL 400 may operate with reduced or minimized phase noise. Under this condition, the digital signals associated with the feedback signal 106 and the delayed reference signal 404 may have rising edges that are aligned at the input of the phase detector 402 resulting in an error signal 406 that includes a stream of a random sequence of +1s and −1s that average out to 0 at the analog gain calibration circuitry 410.

The analog gain calibration circuitry 410 may extract the average value of the error signal 130 as an input value. Having an average value of 0 may result in the analog gain calibration circuitry 410 applying no change to the gain circuitry 114, as there is no mismatch between the time offset 108 and the target time offset 128. Accordingly, if, in query block 456, the analog duty cycle calibration circuitry 408 and/or the analog gain calibration circuitry 410 determines that the delayed reference signal 404 is equal to the target feedback signal 106 based on the average of DC value of the error signal 406, the PLL 400 may return to the process block 452. However, if, in the query block 456, the phase detector 402 determines that the that the delayed reference signal 404 is not equal to the target feedback signal 106 based on the average of the error signal 406, in process block 458, the analog gain calibration circuitry 410 outputs the gain calibration output signal 412 to adjust the parameters of the gain circuitry 114.

If the reference clock signal 104 has a duty cycle error, this may cause the error signal 406 to be periodic at the reference clock signal frequency. Since the average of the +1s and the −1s are equal to zero, the duty cycle error of the PLL 400 does not affect the accuracy of the gain calibration. The analog duty cycle calibration circuitry 408 extracts the average at even data values and odd data values and produces a correction term via duty cycle calibration output signal 414 that compensates for the duty cycle error. In this manner, the method 450 calibrates PLL 400 loop gain and duty cycle via analog gain calibration circuitry 410 and analog duty cycle calibration circuitry 408 using a single phase detector 402 to reduce or minimize PLL phase noise due to PVT variations.

Figure 15:
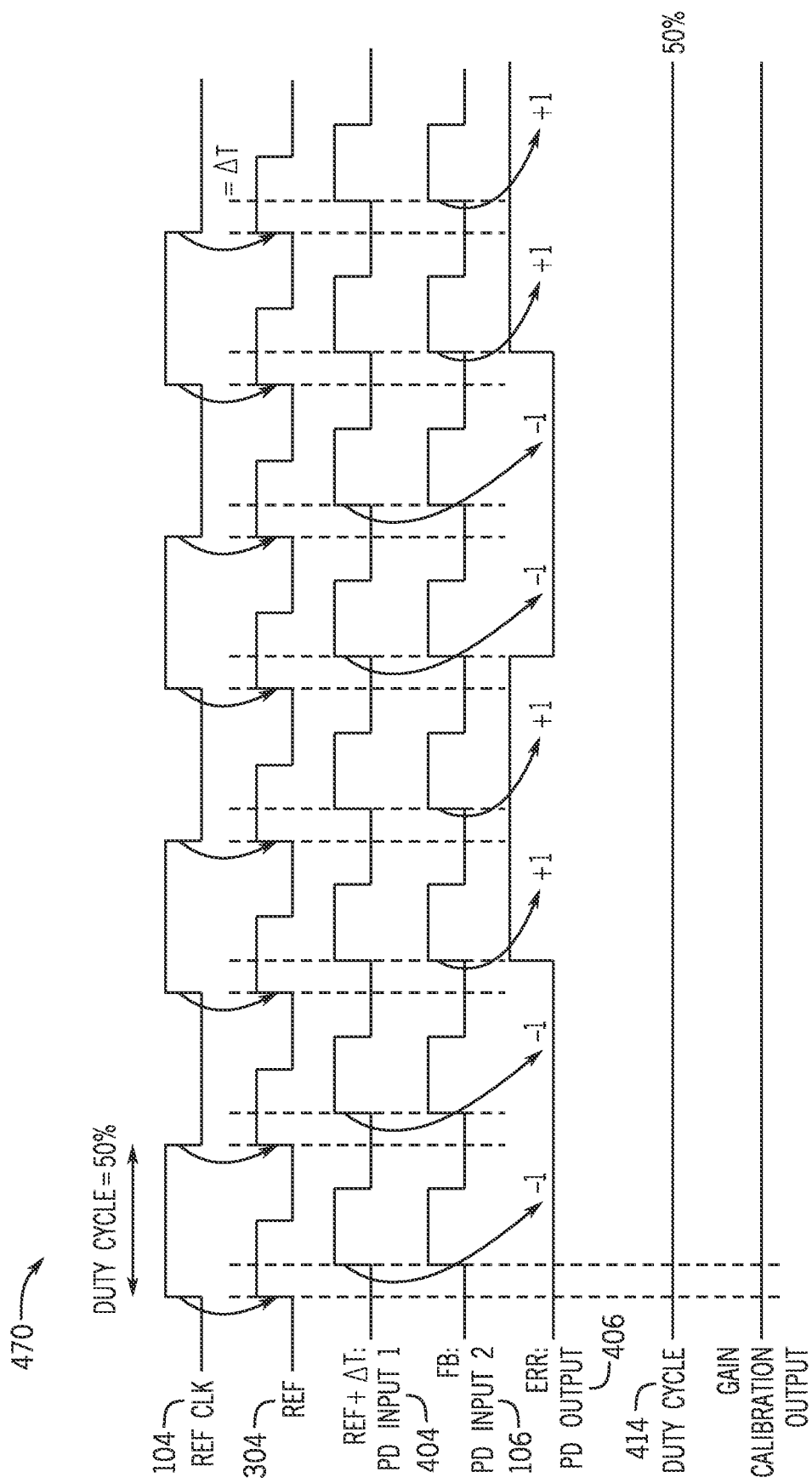
FIG. 15 is a timing diagram illustrating operation of the PLL of FIG. 13 under steady state conditions, according to embodiments of the present disclosure.

FIG. 15 is a timing diagram 470 illustrating operation of the PLL 400 under steady state conditions, according to an embodiment of the present disclosure. As may be observed from the timing diagram 470, when the rising edges of the feedback signal 106 and the rising edges of the delayed reference signal 404 are aligned, the error signal 406 outputs an even number of +1s and −1s. It should be noted that, as the analog duty cycle calibration circuitry 408 and/or the analog gain calibration circuitry 410 extract an average of the DC value of the error signal 406, not each and every rising edge may be aligned between the delayed reference signal 404 and the feedback signal 106, but they, on average may be aligned (e.g., such that there are an even number of +1s and −1s extracted by the analog duty cycle calibration circuitry 408 and/or the analog gain calibration circuitry 410). Due to the even number of +1s and −1s, the analog duty cycle calibration circuitry 408 refrains from adjusting the duty cycle of the PLL 400 and the analog gain calibration circuitry 410 refrains from adjusting the loop gain parameters of the gain circuitry 114.

Figure 16:
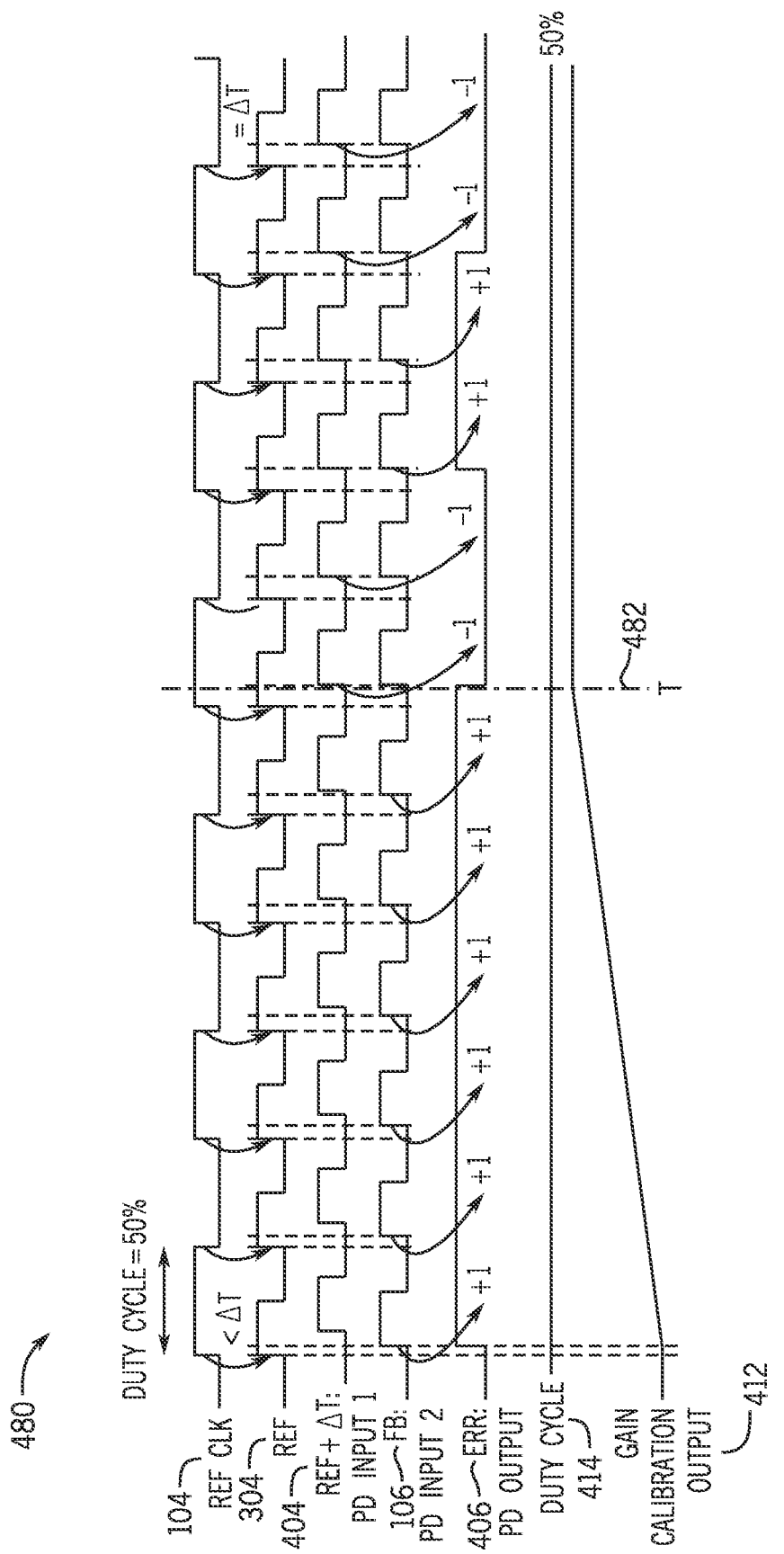
FIG. 16 is a timing diagram illustrating operation of the PLL of FIG. 13 during analog gain calibration, according to embodiments of the present disclosure.

FIG. 16 is a timing diagram 480 operation of the PLL 400 during analog gain calibration, according to embodiments of the present disclosure. As may be observed from the timing diagram 480, when the rising edges of the feedback signal 106 and the rising edges of the delayed reference signal 404 are not aligned, the error signal 406 outputs an uneven number of +1s and −1s. When the analog gain calibration circuitry 410 extracts an average of the DC value of the error signal 406, the average of the DC value of the error signal 406 will be nonzero due to the misalignment. The nonzero error signal 406 causes the analog gain calibration circuitry 410 to adjust, via the gain calibration output signal 412, the loop gain parameters of the gain circuitry 114, which in turn adjusts the delay circuitry 308, increasing or decreasing the delay the feedback signal 106 until the delayed reference signal 404 and the feedback signal 106 are realigned and the average error signal 406 returns to 0 at time T 482.

Figure 17:
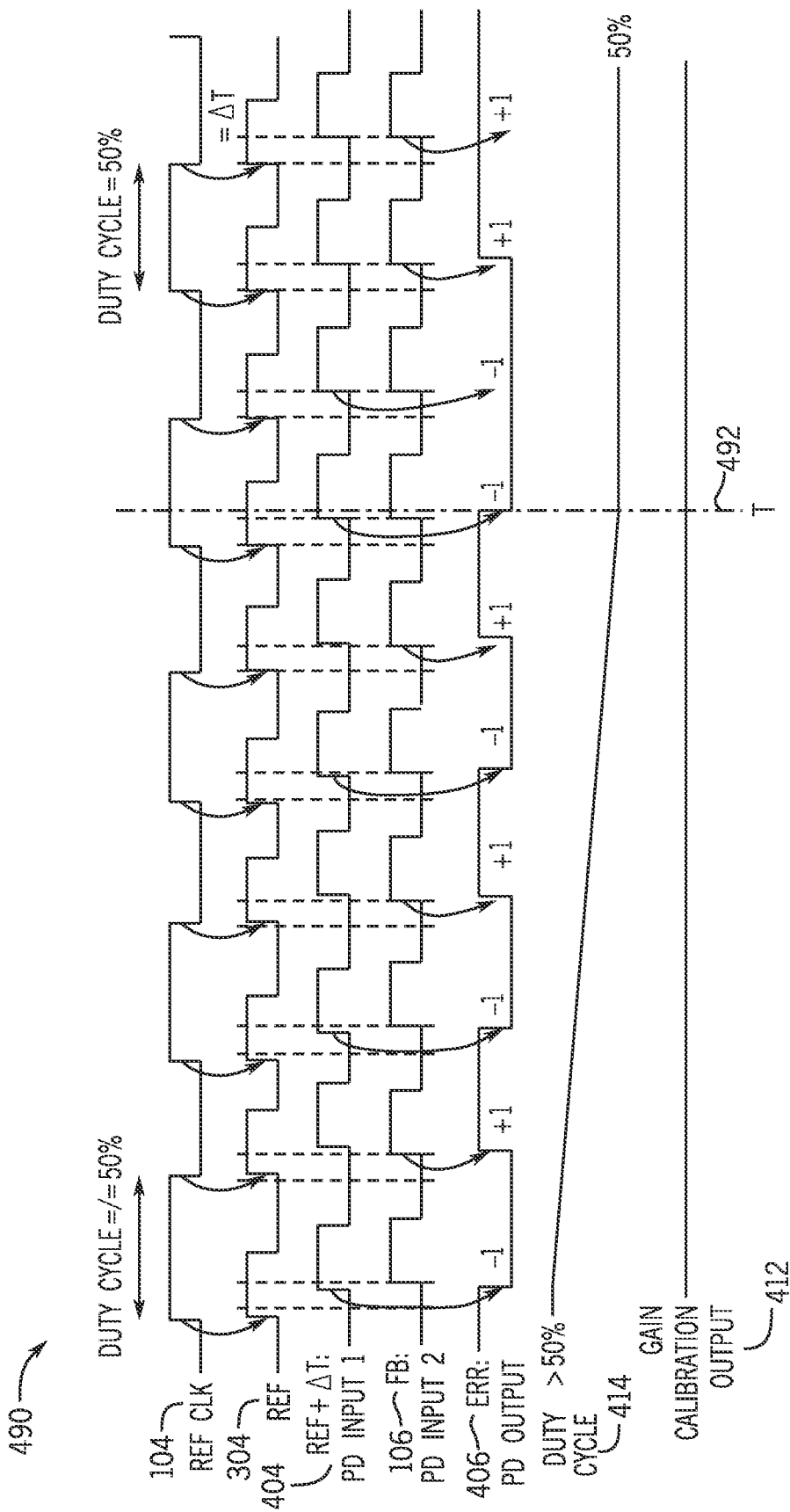
FIG. 17 is a timing diagram illustrating operation of the PLL of FIG. 13 during duty cycle calibration, according to embodiments of the present disclosure.

FIG. 17 is a timing diagram 490 illustrating operation of the PLL 400 during duty cycle calibration, according to embodiments of the present disclosure. As may be observed from the timing diagram 490, since the analog duty cycle calibration circuitry 408 and the analog gain calibration circuitry 410 share the phase detector 402, and since the gain calibration is based on whether the delayed reference signal 404 and the feedback signal 106 are aligned based on the output of the error signal 406 and the gain calibration is based only on whether the output of the error signal 406 is positive or negative, when the delayed reference signal 404 and the feedback signal 106 are aligned, detection mismatch is effectively removed from phase detector, and the duty cycle may operate with increased accuracy. Accordingly, the analog duty cycle calibration circuitry 408 may send the duty cycle calibration output signal 414 to adjust duty cycle calibration until the desired duty cycle (e.g., 50%) is achieved at time T 492.

Figure 18:
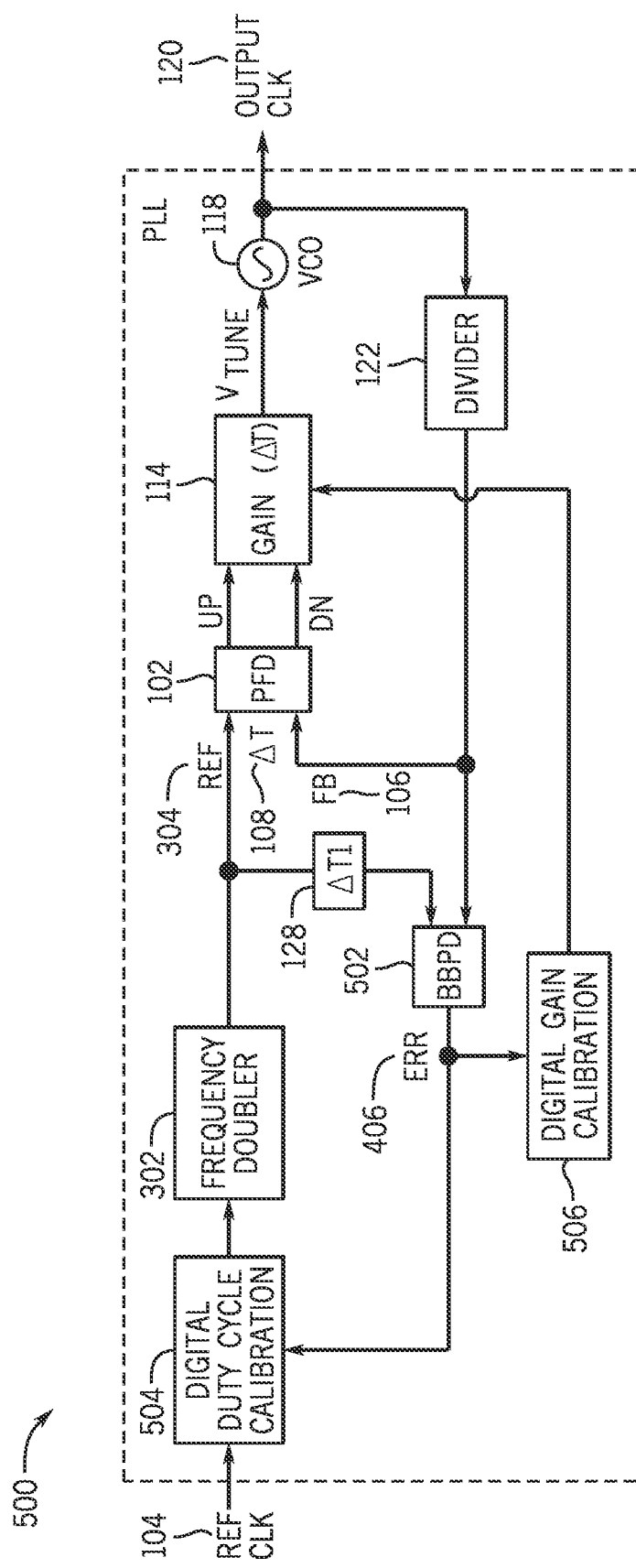
FIG. 18 is a block diagram of a PLL that provides a digital duty cycle calibration and a digital gain calibration using a single Alexander phase detector (e.g., a bang-bang phase detector (BBPD)), according to embodiments of the present disclosure.
Figure 19:
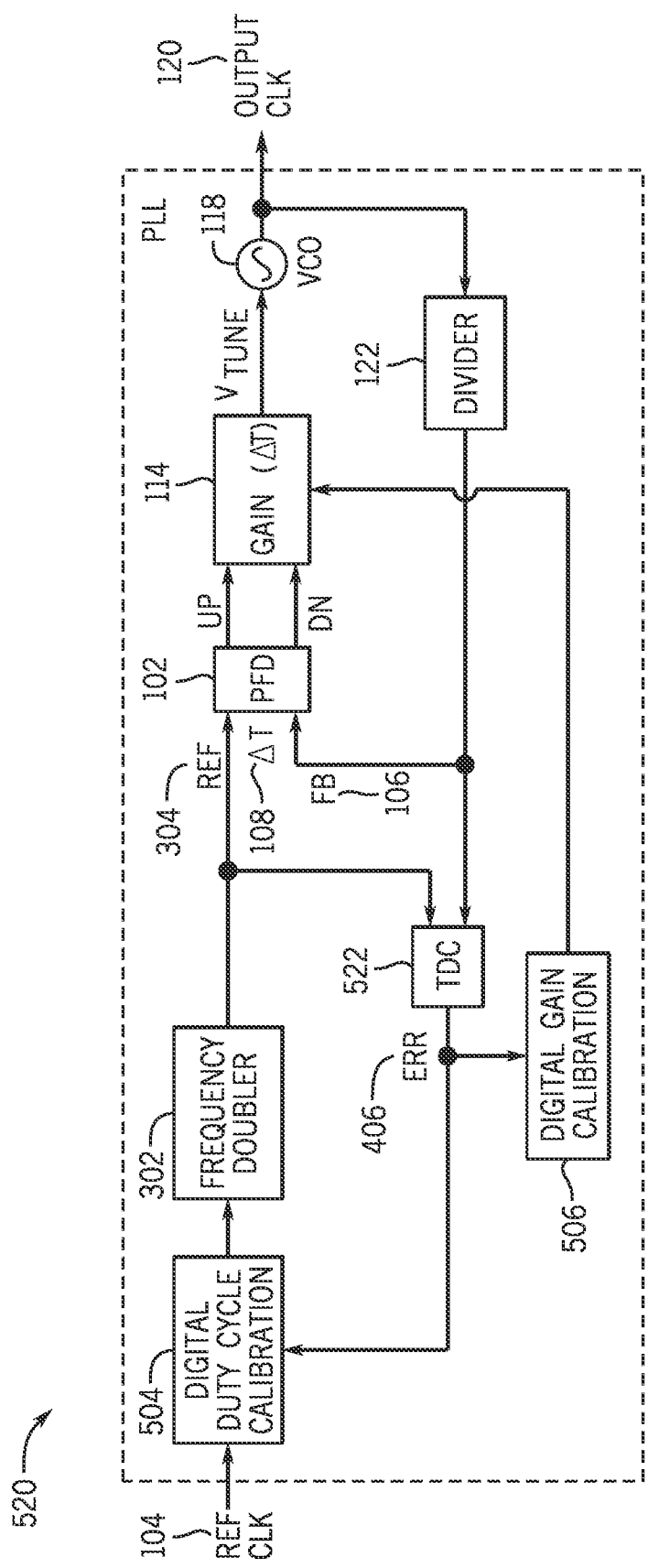
FIG. 19 is a block diagram of a PLL that provides a digital duty cycle calibration and a digital gain calibration using a single time-to-digital-converter (TDC), according to embodiments of the present disclosure.

FIG. 18 is a block diagram of a PLL 500 that provides a digital duty cycle calibration and a digital gain calibration using a single Alexander phase detector 502 (e.g., a bang-bang phase detector (BBPD)), according to an embodiment of the present disclosure. The PLL 500 may utilize digital duty cycle calibration circuitry 504 and digital gain calibration circuitry 506. Similarly, FIG. 19 is a block diagram of a PLL 520 that provides a digital duty cycle calibration and a digital gain calibration using a single time-to-digitalconverter (TDC), according to an embodiment of the present disclosure. via the digital duty cycle calibration circuitry 504 and the digital gain calibration circuitry 506, respectively. The PLL 500 and the PLL 520 may operate similarly to the PLL 400 as described with respect to FIG. 13.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

A transceiver, including: receive circuitry; transmit circuitry; and a phase locked loop (PLL) coupled to the receive circuitry, the transmit circuitry, or both, the PLL including a phase detector coupled to a reference clock generator and feedback circuitry, duty cycle calibration circuitry coupled to an output of the phase detector, duty cycle offset calibration circuitry coupled to the output of the phase detector, and a delay element coupled to an output of the duty cycle offset calibration circuitry.

Wherein the delay element of the transceiver is configured to output a delayed reference signal to the phase detector.

Wherein the transceiver includes a second delay element, wherein the second delay element is disposed between the phase detector and the feedback circuitry and is configured to output a delayed feedback signal to the phase detector.

Wherein the phase detector of the transceiver is configured to output an error signal to the duty cycle calibration circuitry and the duty cycle offset calibration circuitry based on the delayed reference signal and the delayed feedback signal.

Wherein the duty cycle offset calibration circuitry of the transceiver is configured to adjust a delay of the delay element or maintain the delay of the delay element based on an average of the error signal.

Wherein the duty cycle offset calibration circuitry of the transceiver is configured to cause the delay element to output a second delayed reference signal to the phase detector based on the average of the error signal including a nonzero value.

Wherein the duty cycle offset calibration circuitry of the transceiver is configured to cause the delay element to maintain the delayed reference signal based on the average of the error signal including a value of 0.

A phase-locked loop, including: a phase detector configured to receive a reference signal, receive a delayed feedback signal, wherein a delay of the delayed feedback signal is based on a first time offset, and output an error signal based on a first plurality of pulses of the reference signal and a second plurality of pulses of the delayed feedback signal, and duty cycle offset calibration circuitry configured to receive the error signal, and apply a delay to or maintain the reference signal based on the error signal.

Wherein the duty cycle offset circuitry is configured to maintain the reference signal based on an average value of the error signal indicating that the first plurality of pulses aligns with the second plurality of pulses.

Wherein the duty cycle offset circuitry is configured to apply the delay to the reference signal based on an average value of the error signal indicating that the first plurality of pulses does not align with the second plurality of pulses.

The phase-locked loop, including a phase frequency detector configured to receive the reference signal, receive a feedback signal, and determine a second time offset between the reference signal and the feedback signal.

Wherein the phase detector is configured to determine whether the first plurality of pulses aligns or does not align with the second plurality of pulses based on the second time offset including the first time offset.

Wherein the phase-locked loop includes duty cycle calibration circuitry configured to receive a clock signal via a clock generator and the error signal, and configured to adjust a duty cycle of the clock signal based on the error signal.

A method, including: receiving, at a phase detector of a phase-locked loop (PLL), a reference signal; receiving, at the phase detector, a delayed feedback signal; outputting, via the phase detector, an error signal based on the reference signal and the delayed feedback signal; receiving the error signal at duty cycle offset calibration circuitry; outputting, from the duty cycle offset calibration circuitry, a calibration signal to a delay element based on the reference signal and the delayed feedback signal; and delaying or maintaining, via the delay element, the reference signal based on the calibration signal.

Wherein the method includes delaying, via the delay element, the delayed feedback signal based on a time offset delay element configured to apply a time offset.

Wherein the method includes receiving, at an additional phase detector, a time offset between the reference signal and a feedback signal.

Wherein the method includes delaying or maintaining, via the delay element, the reference signal based on the time offset equating to the time offset.

Wherein the method includes delaying or maintaining, via the delay element, the reference signal based on a first plurality of pulses of the reference signal aligning with a second plurality of pulses of the delayed feedback signal.

Wherein the method includes maintaining, via the delay element, the reference signal based on a first plurality of pulses of the reference signal aligning with a second plurality of pulses of the delayed feedback signal.

Wherein the method includes delaying the reference signal, via the delay element, based on a first plurality of pulses of the reference signal not aligning with a second plurality of pulses of the delayed feedback signal.

A transceiver, including: receive circuitry; transmit circuitry; and a phase-locked loop (PLL) coupled to the receive circuitry, the transmit circuitry, or both, the PLL including a first phase detector, gain circuitry coupled to an output of the first phase detector, a second phase detector, and gain calibration circuitry coupled to an output of the second phase detector and an input of the gain circuitry.

Wherein the first phase detector is configured to receive a reference signal and a feedback signal and determine a time offset between the reference signal and the feedback signal.

Wherein the second phase detector is configured to receive a delayed reference signal and the feedback signal, and output an error signal to the gain calibration circuitry based on the delayed reference signal and the feedback signal.

Wherein the gain calibration circuitry is configured to maintain parameters of the gain circuitry based on an indication that a first plurality of pulses of the delayed reference signal aligns with a second plurality of pulses of the feedback signal.

Wherein the gain calibration circuitry is configured to adjust parameters of the gain circuitry based on an indication that a first plurality of pulses of the delayed reference signal does not align with a second plurality of pulses of the feedback signal.

Wherein the indication includes an average of a direct current value of the error signal.

Wherein the gain calibration circuitry is configured to adjust the parameters of the gain circuitry by adjusting a phase of the feedback signal such that the feedback signal is in phase with the delayed reference signal.

Wherein the transceiver includes delay circuitry coupled to an input of the second phase detector.

Wherein the delay circuitry is configured to generate the delayed reference signal by adding a delay to the reference signal.

A phase-locked loop, including: a phase detector configured to receive a delayed reference signal, receive a feedback signal, and output an error signal based on a first plurality of pulses of the delayed reference signal and a second plurality of pulses of the feedback signal, and gain calibration circuitry configured to receive the error signal, and adjust loop gain parameters of the phase-locked loop based on an average value of the error signal.

Wherein the gain calibration circuitry is configured to adjust the loop gain parameters based on the average value of the error signal including a nonzero value.

Wherein the gain calibration circuitry is configured to adjust the loop gain parameters such that the average value of the error signal includes a value of zero.

Wherein the average value of the error signal includes the value of zero when the first plurality of pulses of the delayed reference signal are aligned with the second plurality of pulses of the feedback signal.

Wherein the phase-locked loop includes an additional phase detector configured to receive a second reference signal, receive the feedback signal, and determine a first time offset between the second reference signal and the feedback signal.

Wherein the first plurality of pulses of the delayed reference signal are aligned with the second plurality of pulses of the feedback signal when the first time offset includes a second time offset.

Wherein the gain calibration circuitry is configured to maintain the loop gain parameters based on the average value of the error signal including a value of zero.

A method, including: receiving, at a phase detector of a phase-locked loop (PLL), a delayed reference clock signal; receiving, at the phase detector, a feedback signal; outputting, via the phase detector, an error signal based on the delayed reference clock signal and the feedback signal; receiving the error signal at gain calibration circuitry; and adjusting or maintaining loop gain parameters of the PLL by the gain calibration circuitry based on the error signal.

Wherein the method includes receiving, at a phase-frequency detector (PFD), a reference signal and the feedback signal; and outputting, by the PFD, a time offset based on the reference signal and the feedback signal.

Wherein loop gain of the PLL is a function of the time offset.

Wherein the method includes determining, via the gain calibration circuitry, an average of a direct current (DC) value of the error signal, and refrains from adjusting the loop gain parameters based on determining that the DC value includes zero or adjusts the loop gain parameters based on determining that the DC value includes a nonzero value.

What is claimed is:

1. A transceiver, comprising:
   receive circuitry;
   transmit circuitry; and
   a phase-locked loop (PLL), the PLL comprising:
      a phase detector coupled to a delay element and feedback circuitry,
      duty cycle calibration circuitry coupled to an output of the phase detector, and
      gain calibration circuitry coupled to the output of the phase detector and an input of gain circuitry.

2. The transceiver of claim 1, comprising frequency doubling circuitry coupled to an output of the duty cycle calibration circuitry.

3. The transceiver of claim 2, comprising an additional phase detector coupled to an output of the frequency doubling circuitry, the additional phase detector configured to receive a reference signal and a feedback signal from the feedback circuitry.

4. The transceiver of claim 3, wherein the additional phase detector is configured to determine a first time offset between the reference signal and the feedback signal.

5. The transceiver of claim 4, wherein the gain calibration circuitry is configured to adjust loop gain parameters of the gain circuitry based on the first time offset being equal to a second time offset associated with the delay element.

6. The transceiver of claim 4, wherein the gain calibration circuitry is configured to maintain loop gain parameters of the gain circuitry based on the first time offset being unequal to a second time offset associated with the delay element.

7. The transceiver of claim 1, wherein the duty cycle calibration circuitry comprises analog duty cycle calibration circuitry and the gain calibration circuitry comprises analog gain calibration circuitry.

8. A phase-locked loop (PLL), comprising:
   a phase detector configured to
   receive a delayed reference signal,
   receive a feedback signal, and
   output an error signal based on a first plurality of pulses of the delayed reference signal aligning with a second plurality of pulses of the feedback signal,
   gain calibration circuitry configured to
   receive the error signal,
   output an average value of the error signal, and
   adjust loop gain parameters or maintain the loop gain parameters of the PLL based on the average value of the error signal, and
   duty cycle calibration circuitry configured to
   receive the error signal,
   output the average value of the error signal, and
   output a duty cycle correction based on the average value of the error signal comprising a positive value or a negative value.

9. The PLL of claim 8, comprising a delay element configured to apply a time offset to generate the delayed reference signal.

10. The PLL of claim 8, wherein the gain calibration circuitry is configured to adjust the loop gain parameters of the PLL based on the average value of the error signal indicating that the first plurality of pulses of the delayed reference signal does not align with the second plurality of pulses of the feedback signal.

11. The PLL of claim 8, wherein the gain calibration circuitry is configured to maintain the loop gain parameters of the PLL based on the average value of the error signal indicating that the first plurality of pulses of the delayed reference signal aligns with the second plurality of pulses of the feedback signal.

12. The PLL of claim 8, comprising a phase frequency detector configured to determine a time offset based on a reference signal and the feedback signal.

13. The PLL of claim 8, wherein the phase detector comprises an Alexander phase detector.

14. A method, comprising:
    receiving a reference signal at a time-to-digital converter (TDC) of a phase-locked loop (PLL);
    receiving a feedback signal at the TDC from feedback circuitry; and
    outputting, via the TDC, an error signal to gain calibration circuitry and duty cycle calibration circuitry based on whether a first plurality of pulses associated with the reference signal are aligned with a second plurality of pulses associated with the feedback signal.

15. The method of claim 14, comprising determining, via the gain calibration circuitry, whether the reference signal and the feedback signal are in-phase based on an indication that the first plurality of pulses and the second plurality of pulses are aligned.

16. The method of claim 15, comprising maintaining, via the gain calibration circuitry, loop gain parameters of gain circuitry of the PLL based on determining that the reference signal and the feedback signal are in-phase.

17. The method of claim 14, comprising determining, via the gain calibration circuitry, whether the reference signal and the feedback signal are out of phase based on an indication that the first plurality of pulses and the second plurality of pulses are unaligned.

18. The method of claim 17, comprising adjusting, via the gain calibration circuitry, loop gain parameters of gain circuitry of the PLL based on determining that the reference signal and the feedback signal are out of phase.

19. The method of claim 14, comprising adjusting, via the duty cycle calibration circuitry, a duty cycle of the reference signal based on an average direct current (DC) value of the error signal comprising a nonzero value.

20. The method of claim 19, comprising determining, via the duty cycle calibration circuitry, the average DC value of the error signal comprises the nonzero value.

* * * * *